United States Patent
Yamane et al.

(10) Patent No.: US 7,045,899 B2
(45) Date of Patent: May 16, 2006

(54) SEMICONDUCTOR DEVICE AND FABRICATION METHOD OF THE SAME

(75) Inventors: Tae Yamane, Tokyo (JP); Jyouji Katsuno, Tokyo (JP); Kiyohisa Fukaya, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/681,283

(22) Filed: Oct. 9, 2003

(65) Prior Publication Data

US 2004/0070064 A1 Apr. 15, 2004

(30) Foreign Application Priority Data

Oct. 15, 2002 (JP) .............................. 2002-301019

(51) Int. Cl.
*H01L 23/48* (2006.01)
(52) U.S. Cl. ....................................... 257/777; 257/688
(58) Field of Classification Search ................ 257/686, 257/692, 698, 774, 777
See application file for complete search history.

(56) References Cited

U.S. PATENT DOCUMENTS

| | | | |
|---|---|---|---|
| 5,973,403 A * | 10/1999 | Wark | 257/777 |
| 6,348,728 B1 | 2/2002 | Aiba et al. | |
| 6,400,021 B1 | 6/2002 | Cho | |
| 6,413,797 B1 | 7/2002 | Oka et al. | |
| 6,414,396 B1 * | 7/2002 | Shim et al. | 257/778 |
| 6,765,299 B1 * | 7/2004 | Takahashi et al. | 257/777 |
| 6,836,025 B1 * | 12/2004 | Fujisawa et al. | 257/782 |
| 2001/0038151 A1 | 11/2001 | Takahashi et al. | |
| 2002/0047213 A1 | 4/2002 | Komiyama et al. | |

FOREIGN PATENT DOCUMENTS

| | | |
|---|---|---|
| JP | 10-308415 | 11/1998 |
| JP | 11-135714 | 5/1999 |
| JP | 2001-035994 | 2/2001 |
| JP | 2001144197 A | 5/2001 |
| JP | 2001-257310 | 9/2001 |
| JP | 2001-274319 | 10/2001 |
| JP | 2002064163 A | 2/2002 |
| JP | 2002-110898 | 4/2002 |
| JP | 2002110898 A | 4/2002 |
| JP | 2002-170852 | 6/2002 |
| JP | 2003-504849 | 2/2003 |
| WO | WO 01/031189 | 1/2001 |

* cited by examiner

*Primary Examiner*—Leonardo Andujar
(74) *Attorney, Agent, or Firm*—VolentineFrancos&Whitt, PLLC

(57) ABSTRACT

A semiconductor device includes semiconductor chips, a first conductive pattern, an external terminal and an encapsulating resin. Each of the semiconductor chips has a front side formed with integrated circuits and a back side. The semiconductor chips are stacked each other. The first conductive pattern electrically connects the integrated circuits. The external terminal is electrically connected to the first conductive pattern. The encapsulating resin encapsulates the semiconductor chips and the first conductive pattern.

16 Claims, 44 Drawing Sheets

SEMICONDUCTOR DEVICE AND FABRICATION METHOD OF THE SAME

BACKGROUND OF THE INVENTION

The present invention relates to a semiconductor device formed into a multi-chip (MCP: Multi-Chip Package) by using CSP (Chip Size Package), and to a fabrication method of the same.

In recent years, with the realization of reducing electronic devices in size, there is a semiconductor package called CSP (Chip Size Package) having almost the same size as a semiconductor chip in order to allow high density mounting in mounting a semiconductor device. Then, as similar to a plurality of the CSPs, there is MCP (Multi-Chip Package) in which semiconductor chips are incorporated in a single package and formed into a multi-chip in order to mount the chips in high density (for example, JP-A-2000-110898).

FIG. 51 shows one example of the structure of MCP in which traditional semiconductor chips are formed into a multi-chip described in JP-A-2000-110898. In a semiconductor device 100 shown in FIG. 51, a first semiconductor chip 90 and a second semiconductor chip 92 are layered on an insulating substrate 90 functioning as an interposer, the integrated circuits of the chips are electrically connected to ball electrodes 96 as external terminals by wires 94, and they are encapsulated with an encapsulating resin 98.

SUMMARY OF THE INVENTION

However, in the MCP having the configuration above, it is expected that the present MCP structure cannot response to the demand of reducing packages in size by the market in the future in intending the reduction of packaging areas in size because the semiconductor chips are layered on the substrate called the interposer. In addition, since wire bonding is adopted for connecting the semiconductor chips each other, it cannot response to complex wiring. Therefore, improvements are required to intend the reduction of packaging areas in size in the future.

Accordingly, a problem of the invention is to solve the problems before and to achieve an object below. More specifically, an object of the invention is to provide a semiconductor device intending the reduction of packaging areas in size to realize a multi-chip, and a fabrication method of the same.

The problem is to be solved by the following scheme. More specifically, the invention is a semiconductor device characterized by having:

a plurality of semiconductor chips layered having a front side formed with integrated circuits and a back side;

a first wiring for electrically connecting between the integrated circuits of the plurality of the semiconductor chips;

an external terminal electrically connected to the first wiring; and an encapsulating resin for encapsulating the plurality of the semiconductor chips and the first wiring.

BRIEF DESCRIPTION OF THE DRAWINGS

The teachings of the invention can be readily understood by considering the following detailed description in conjunction with the accompanying drawings, in which:

FIG. 13A is a partial plan view and FIG. 13B is a partial cross-sectional view;

FIG. 14A is a partial plan view and FIG. 14B is a partial cross-sectional view;

FIG. 15A is a plan view and FIG. 15B is a cross-sectional view;

DESCRIPTION OF THE PREFERRED EMBODIMENT

Figure 1:
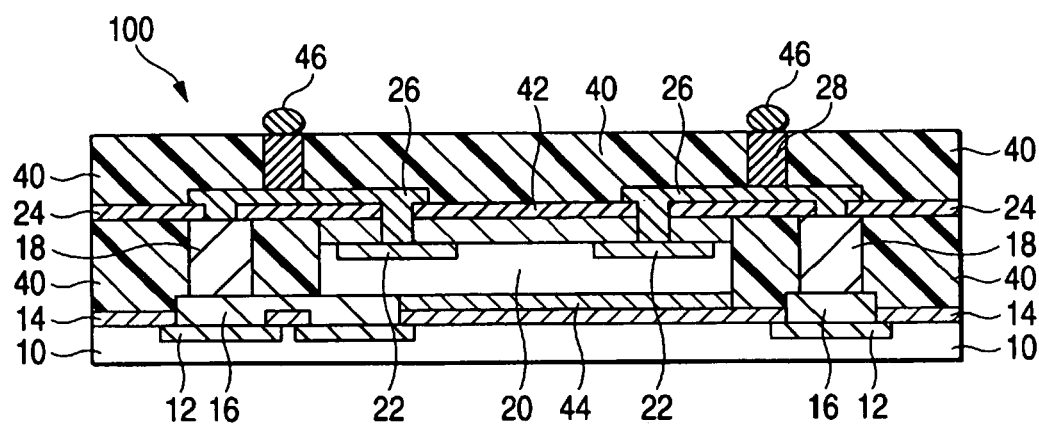
FIG. 1 is a cross-sectional view illustrating the structure of a semiconductor device in a first embodiment.

Hereafter, embodiments of the invention will be described with reference to the drawings. Additionally, those having substantially the same functions are designated the same reference numerals and signs for description throughout the drawings, and the description may be omitted according to the circumstances.

First Embodiment

FIG. 1 is a cross-sectional view illustrating the structure of a semiconductor device in a first embodiment. FIGS. 2A to 8V are cross-sectional views illustrating a fabrication method of the semiconductor device in the first embodiment.

In a semiconductor device 100 shown in FIG. 1, a 2nd semiconductor chip 20 (second semiconductor chip) formed with integrated circuits (not shown) is mounted on a 1st semiconductor chip 10 (first semiconductor chip) formed with integrated circuits (not shown) as layered in the direction nearly orthogonal to the front side of the chip, and they are encapsulated with an encapsulating resin 40.

The 1st semiconductor chip 10 has pad electrodes 12 electrically connected to the integrated circuits thereon, and has a first insulating film 14 (polyimide, for example) formed in the portions other than the pad electrodes 12. The 1st semiconductor chip 10 is formed with a first rewiring layer 16 for electrically connecting the pad electrodes 12 each other or to the integrated circuits of the 2nd semiconductor chip 20, and a part of the first rewiring layer 16 is formed to cover the adjacent pad electrodes 12 (second wiring). Then, first metal post interconnects 18 for electrically connecting to the integrated circuits of the 2nd semiconductor chip 20 are formed on the first rewiring layer 16.

The 2nd semiconductor chip 20 has pad electrodes 22 electrically connected to the integrated circuits thereon, and the front side is protected by a passivation,insulating tape 42. The 2nd semiconductor chip 20 is mounted on the 1st semiconductor chip 10 by dice bonding with an adhesive tape 44 in the side opposite to the side formed with the integrated circuits. A second insulating film 24 for forming a second rewiring layer 26 is formed on the mounted 2nd semiconductor chip 20.

The first metal post interconnects 18 are electrically connected to the pad electrodes 22 of the 2nd semiconductor chip 20 by the second rewiring layer 26, and the integrated circuits of the 1st semiconductor chip 10 and the 2nd semiconductor chip 20 are electrically connected to each other. Second metal post interconnects 28 are formed on the second rewiring layer 26, and ball electrodes 46 being external terminals are formed on the tip ends of the second metal post interconnects 28.

Hereafter, one example of a fabrication method of the semiconductor device 100 shown in FIG. 1 will be described.

Figure 2A:
FIGS. 2A to 2F are cross-sectional views illustrating a fabrication method of the semiconductor device in the first embodiment.
Figure 2B:
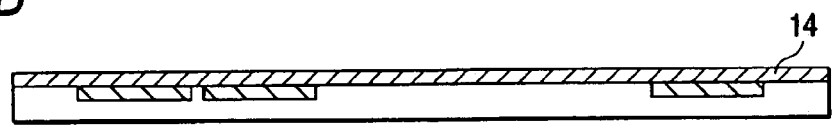
Figure 2C:
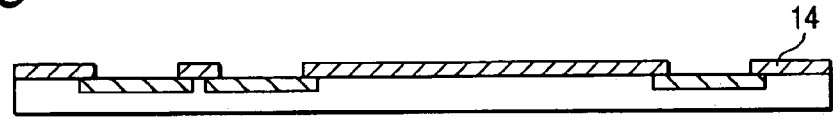
Figure 2D:
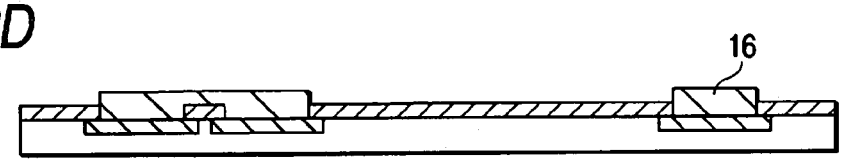
Figure 2E:
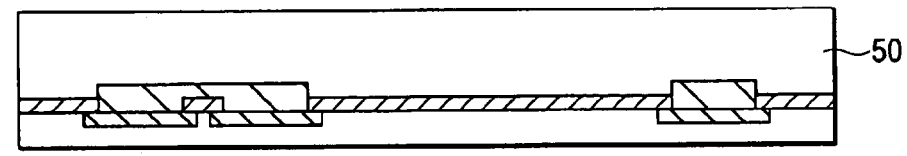

First, a wafer 48 formed with devices to be the 1st semiconductor chip 10 is prepared (FIG. 2A). The first insulating film 14 (a polyimide film, for example) is coated by spin coating on the wafer 48 where a passivation film of the pad electrodes 12 is removed (FIG. 2B). To have contact with the pad electrodes 12, a mask is used for exposure to etch the first insulating film 14 (FIG. 2C). The first rewiring layer 16 is formed as the base for forming interconnects between the pad electrodes, and the first metal post interconnects 18 by sputtering or plating (FIG. 2D).

Figure 2F:
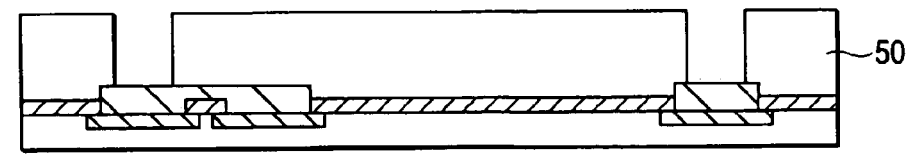
Figure 3G:
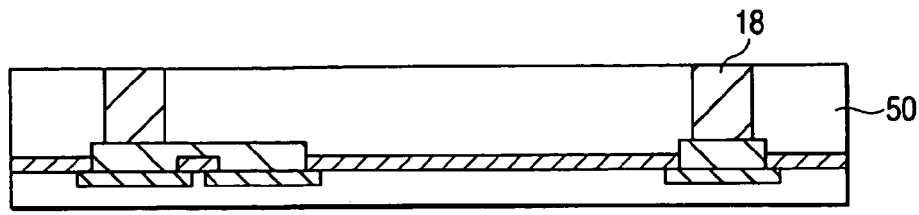
FIGS. 3G to 3J are cross-sectional views illustrating the fabrication method of the semiconductor device in the first embodiment.
Figure 3H:
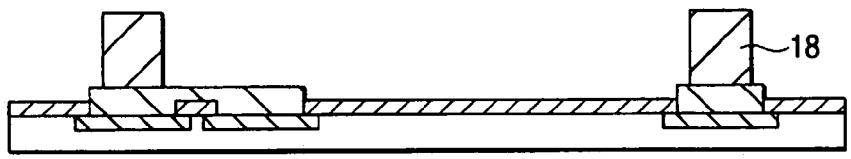

Subsequently, a resist 50 is coated over the wafer 48 for forming the first metal post interconnects 18 (FIG. 2E) To form the first metal post interconnects 18, a mask is used for exposure and then etching to form openings in the resist 50 (FIG. 2F). The first metal post interconnects 18 are formed by plating (FIG. 3G). The resist 50 is removed for cleaning (FIG. 3H). Here, since the first metal post interconnects 18 structurally need to be raised more than the thickness of the 2nd semiconductor chip 20, it is acceptable to repeat the process steps from FIGS. 2E to 3G when a predetermined height cannot be obtained at one time.

Figure 3I:
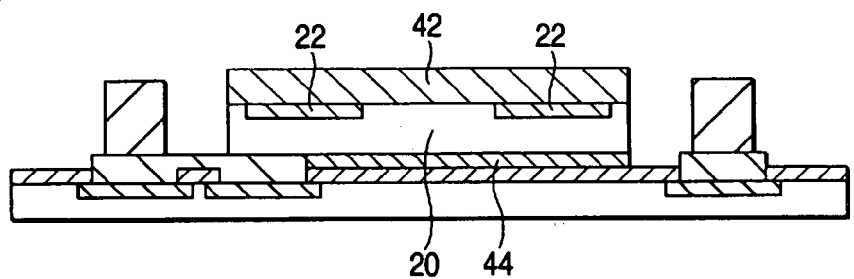
Figure 9:
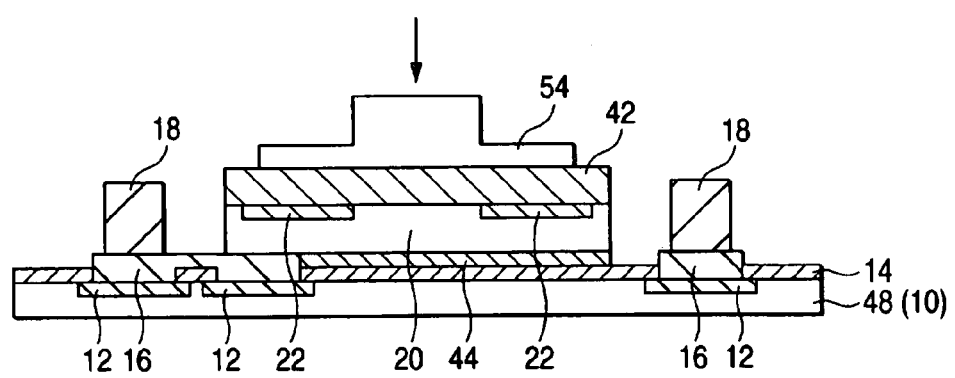
FIG. 9 is a schematic diagram illustrating an example of mounting a 2nd semiconductor chip by a flat collet in the semiconductor device in the first embodiment.
Figure 10:
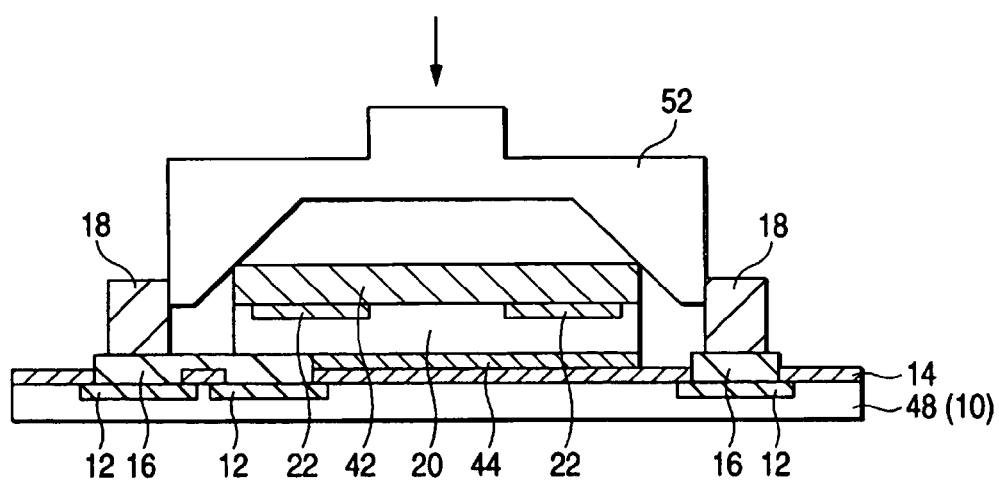
FIG. 10 is a schematic diagram illustrating an example of mounting the 2nd semiconductor chip by a pyramid collet in the semiconductor device in the first embodiment.

After that, the 2nd semiconductor chip 20 with the passivation insulating tape 42 (a polyimide tape, for example) is mounted on the wafer 48 (the 1st semiconductor chip 10) by dice bonding with the adhesive tape 44 (FIG. 3I). Preferably, the 2nd semiconductor chip 20 is dice bonded while the 2nd semiconductor chip 20 is being vacuumed by a flat collet 54 having the same size as the surface area of the 2nd semiconductor chip 20 or below as shown in FIG. 9. As shown in FIG. 10, when the both ends of the 2nd semiconductor chip 20 are sandwiched by a pyramid collet 52 for dice bonding, the terminals other than the chip such as the first metal post interconnects 18 are likely to have contact, which often causes the reductions in production yields and reliability. On this account, in the embodiment, the flat collet 54 is used to dice bond the 2nd semiconductor chip 20 while vacuuming it as shown in FIG. 9. Therefore, the chip is prevented from contacting the terminals other than the chip such as the first metal post interconnects 18, and production yields and reliability are increased.

Figure 3J:
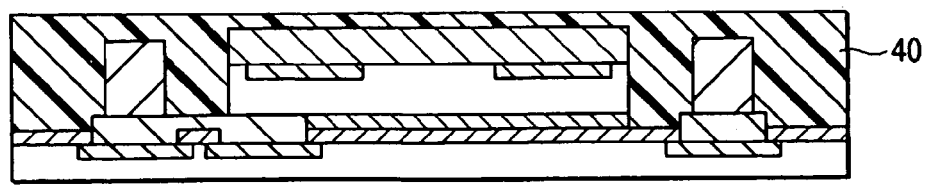
Figure 4K:
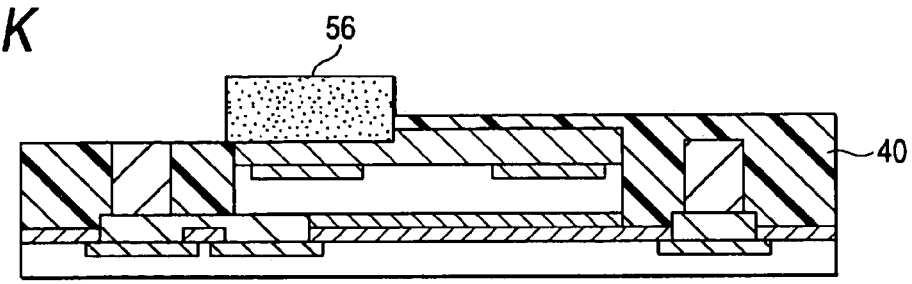
FIGS. 4K to 4M are cross-sectional views illustrating the fabrication method of the semiconductor device in the first embodiment.
Figure 4L:
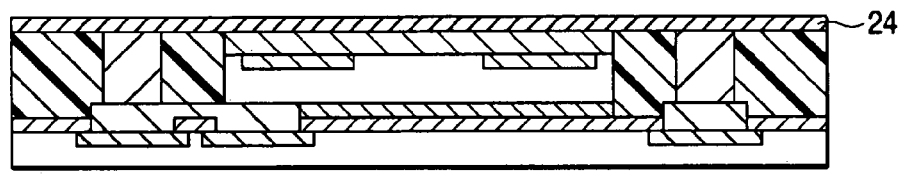
Figure 4M:
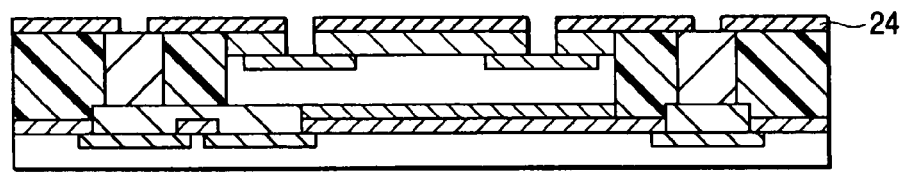
Figure 5N:
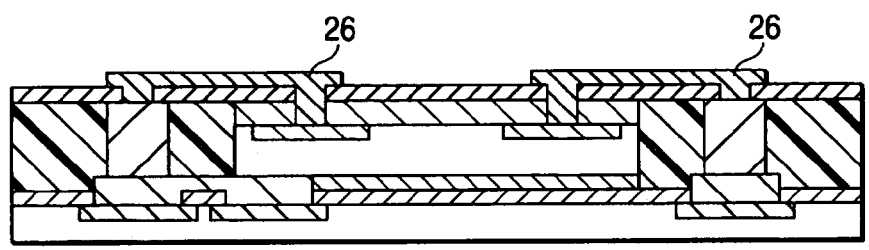
FIGS. 5N and 5O are cross-sectional views illustrating the fabrication method of the semiconductor device in the first embodiment.

Subsequently, the periphery (circumference) of the wafer 48 is surrounded by a mold, the liquid encapsulating resin 40 is coated from the top of the wafer 48, and then it is cured for resin encapsulation (FIG. 3J). To expose the first metal post interconnects 18 buried in the encapsulating resin 40 outside, the front side is ground by cutting from the top of the wafer 48 with a grinder 56 (a cutting tool, grindstone, and buff) (FIG. 4K). To form the second rewiring layer, the second insulating film (a polyimide tape, for example) is formed on the front side (FIG. 4L). To have contact between the first metal post interconnects 18 and the pad electrodes 22, a mask is used for exposure to etch the second insulating film 24 (FIG. 4M). The second rewiring layer 26 is formed as the base for forming interconnects between the pad electrodes, and the second metal post interconnects 28 by sputtering or plating (FIG. 5N). In this manner, the first metal post interconnects 18 and the pad electrodes 22 of the 2nd semiconductor chip 20 can be rewired simultaneously by sputtering or plating.

Figure 5O:
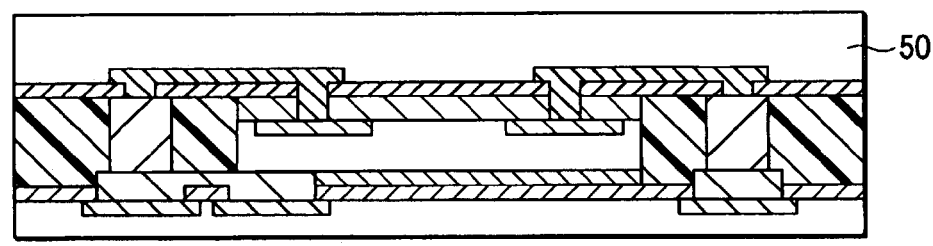
Figure 6P:
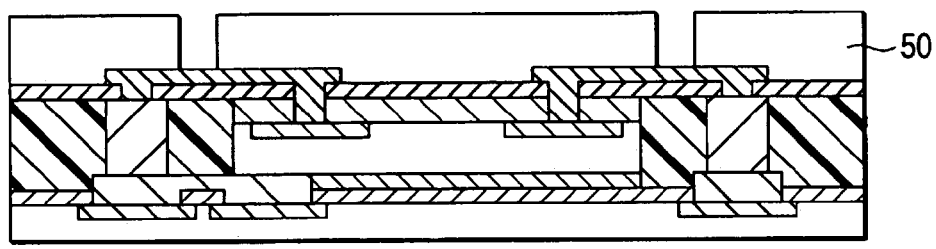
FIGS. 6P to 6R are cross-sectional views illustrating the fabrication method of the semiconductor device in the first embodiment.
Figure 6Q:
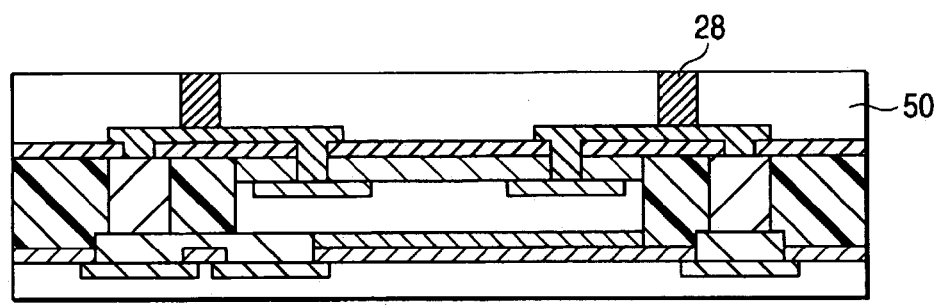
Figure 6R:
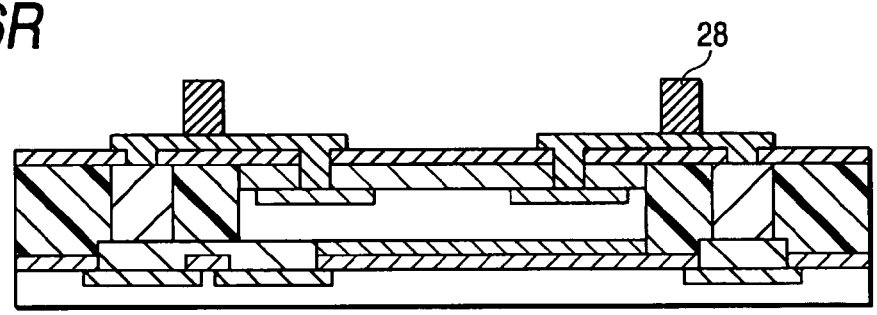
Figure 7S:
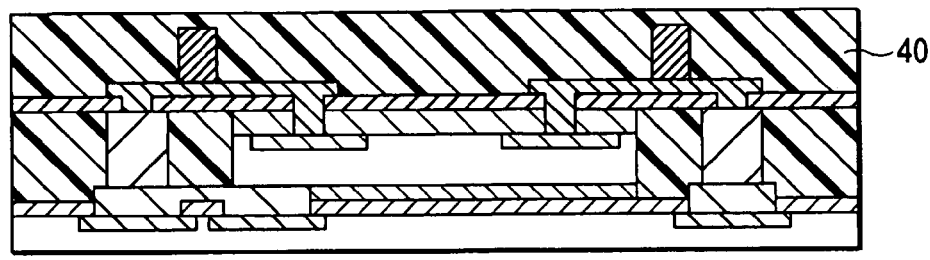
FIGS. 7S to 7U are cross-sectional views illustrating the fabrication method of the semiconductor device in the first embodiment.
Figure 7T:
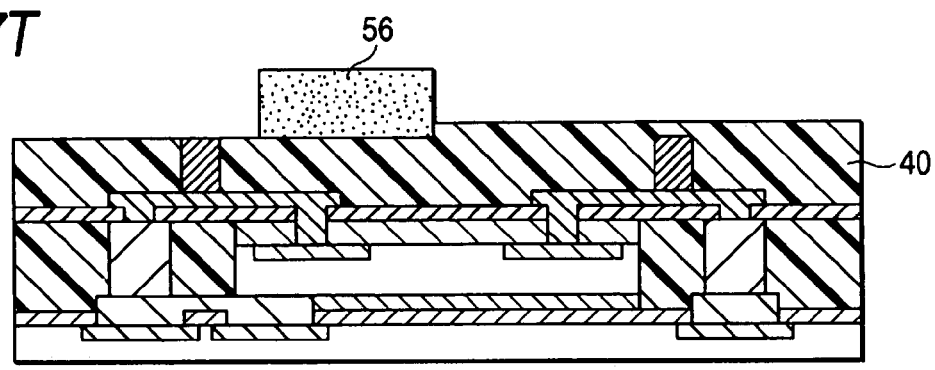
Figure 7U:
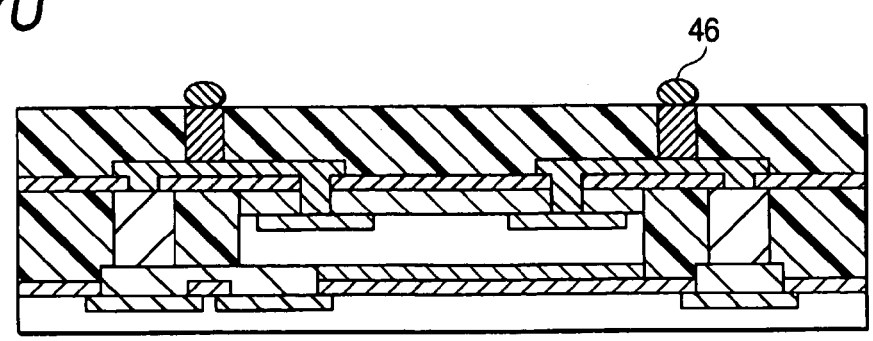
Figure 8V:
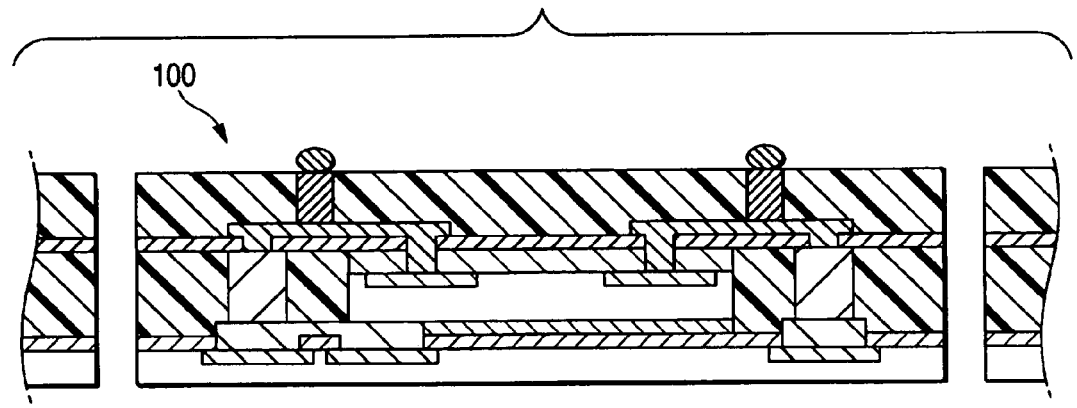
FIG. 8V is a cross-sectional view illustrating the fabrication method of the semiconductor device in the first embodiment.

Then, the resist 50 is coated over the wafer 48 for forming the second metal post interconnects 28 (FIG. 5O). To form the second metal post interconnects 28, a mask is used for exposure and then etching to form openings in the resist 50 (FIG. 6P) The second metal post interconnects 28 are formed by plating (FIG. 6Q). The resist 50 is removed for cleaning (FIG. 6R) Subsequently, the periphery (circumference) of the wafer 48 is surrounded by a mold, the liquid encapsulating resin 40 is coated from the top of the wafer 48, and then it is cured for resin encapsulation (FIG. 7S). To expose the second metal post interconnects 28 buried in the encapsulating resin 40 outside, the front side is ground by cutting from the top of the wafer 48 with the grinder 56 (a cutting tool, grindstone, and buff) (FIG. 7T). The ball electrodes 46 (solder balls) are formed at the tip ends of the exposed second metal post interconnects 28 as external terminals by solder printing (FIG. 7U). Then, after tested, the wafer is separated into pieces by scribing to obtain the semiconductor device 100 (FIG. 8V)

For example, the 2nd semiconductor chip 20 with the passivation insulating tape 42 used here can be fabricated as below.

Figure 11A:
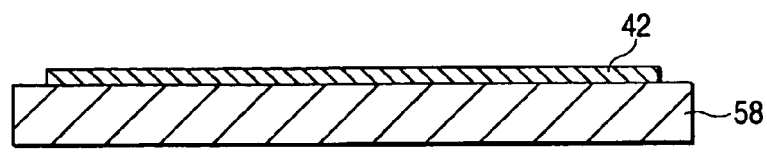
FIGS. 11A to 11D are cross-sectional views illustrating a fabrication method of a 2nd semiconductor chip 20 with a passivation insulating tape 42 in the semiconductor device in the first embodiment.
Figure 11B:
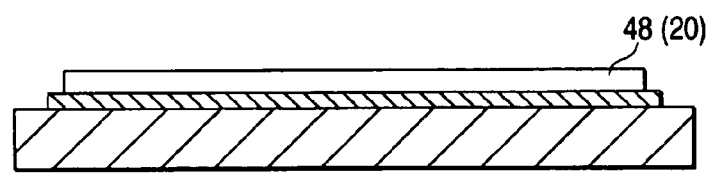
Figure 11C:
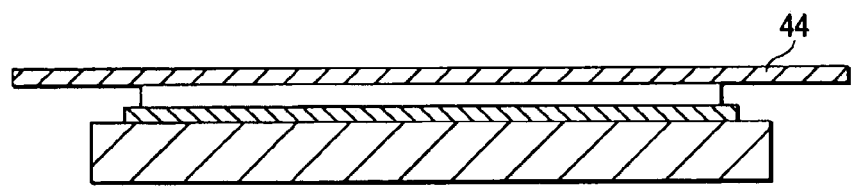
Figure 11D:
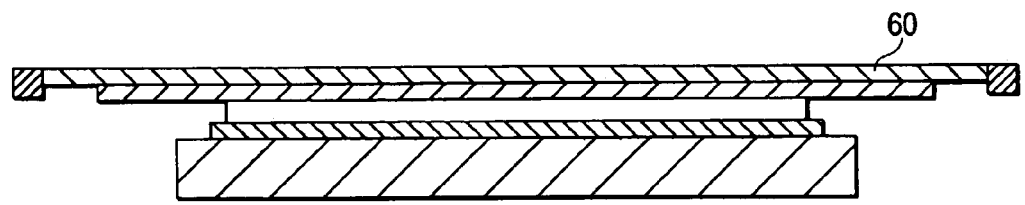
Figure 12E:
FIGS. 12E and 12F are cross-sectional views illustrating the fabrication method of the 2nd semiconductor chip 20 with the passivation insulating tape 42 in the semiconductor device in the first embodiment.
Figure 12F:
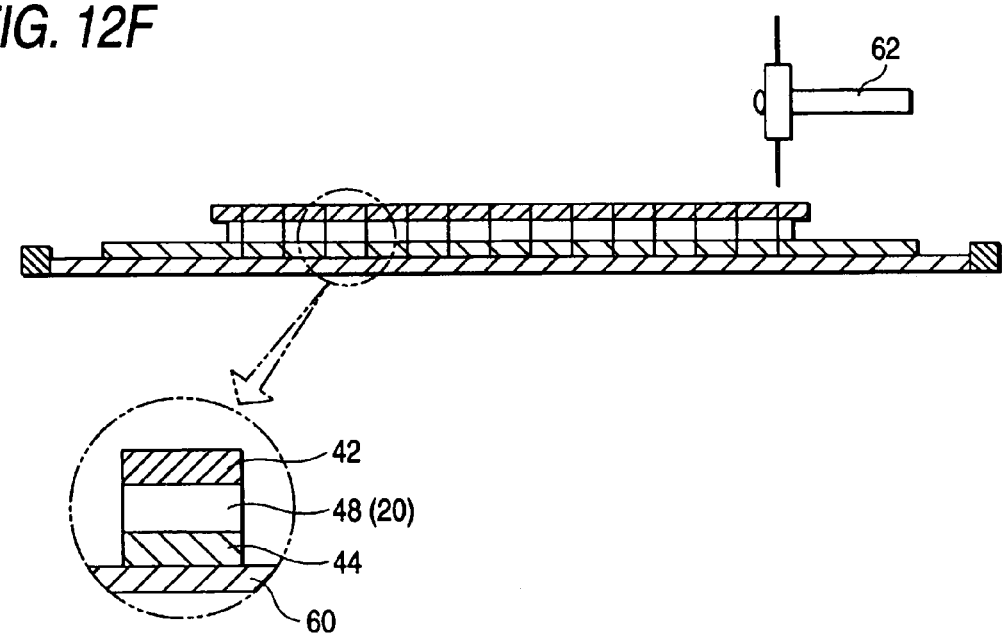

First, the passivation insulating tape 42 is placed on a stage 58 (FIG. 11A). A wafer 48 formed with devices to be the 2nd semiconductor chip 20 (the pad electrodes 22 are not shown) is placed on the passivation insulating tape 42 as the side formed with integrated circuits faces the passivation insulating tape 42 (FIG. 11B). The adhesive tape 44 is attached on the wafer 48 (FIG. 11C). A UV tape 60 is attached on the adhesive tape 44 (general wafer mounting: FIG. 11D). The stage 58 is removed from the wafer 48 (FIG. 12E). Then, a scribe blade 62 is used to separate the wafer 48 in pieces to obtain the 2nd semiconductor chip 20 (FIG. 12F).

In the embodiment, since a plurality of semiconductor chips is mounted as layered in the direction nearly orthogonal to the front side of the chip, the realization of forming a multi-chip is feasible without expanding the packaging area as the package, and the mounting density of the CSP (the functions of the product can be improved) can be enhanced more than that of the traditional CSP. Here, the height is raised more than that of the traditional product but it is about 1 mm. Thus, it is considered to generate problems in mounting. Additionally, the chips are connected by metal interconnects (the metal post interconnects and the rewiring layers (patterning)) formed by sputtering or plating, there by allowing more complex wiring than wire connection traditionally used in the MCP. On this account, the packaging area can be intended to reduce in size.

Furthermore, since the semiconductor chips (CSP) having different specifications are encapsulated in the same package, the combinations of memories and logics, for example, can be produced on the CSP, and development and delivery time can be more shortened than the traditional CSP product (single chip module) does.

Moreover, in dice bonding the 2nd semiconductor chip 20 on the 1st semiconductor chip 10, variations in wetting are generated to cause variations in the tilt and height of the 2nd semiconductor chip when liquid past is used. In forming the second rewiring layer, through holes are formed and plated in the pad electrodes 22 of the 2nd semiconductor chip 20 for conduction. However, when the 2nd semiconductor chip is not horizontal (there are variations in the tilt), the through holes are not formed correctly to influence yields and quality from time to time. Therefore, in the embodiment, the adhesive tape is used to dice bond the 2nd semiconductor chip 20 on the 1st semiconductor chip 10, allowing the tilt and height of the 2nd semiconductor chip 20 to be stable after dice bonded.

In the embodiment, the 2nd semiconductor chip 20 has the passivation insulating tape 42 (a polyimide tape, for example) coated on the side formed with the integrated circuits. Therefore, the direct contact of the front side of the chip with the grinder in grinding the front side or with the flat collet in dice bonding can be prevented, physical scratches are hardly produced in the front side of the chip, and the quality performance and reliability can be improved.

Second Embodiment

Figure 13A:
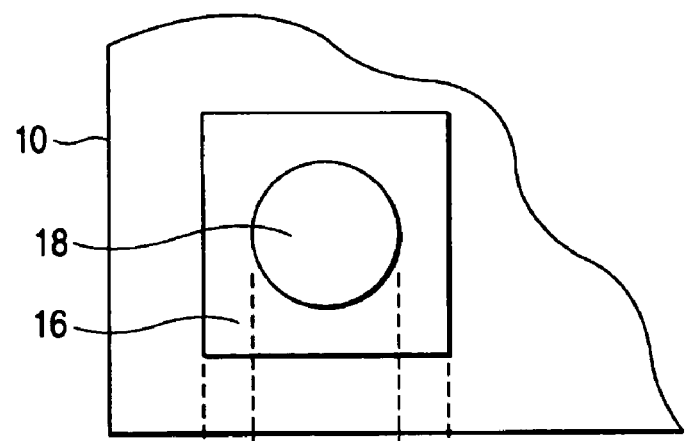
FIGS. 13A and 13B are schematic diagrams partially illustrating the metal post interconnect of a semiconductor device in a second embodiment.
Figure 13B:
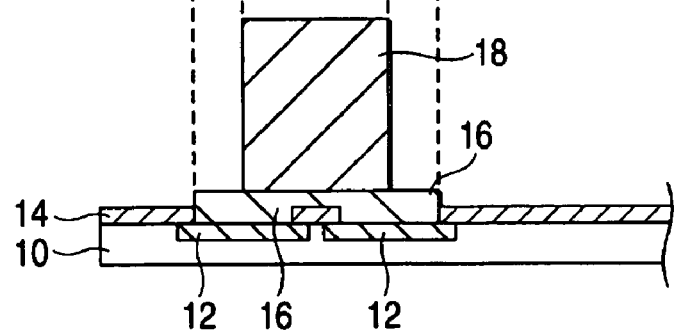
Figure 14A:
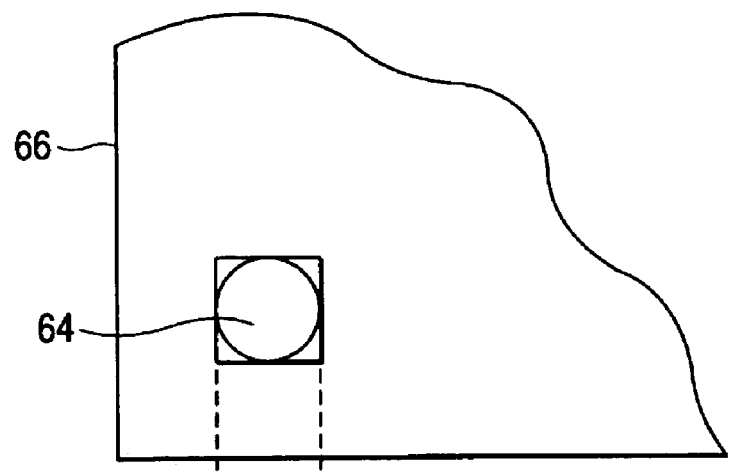
FIGS. 14A and 14B are schematic diagrams partially illustrating the metal post interconnect of a traditional semiconductor device.
Figure 14B:
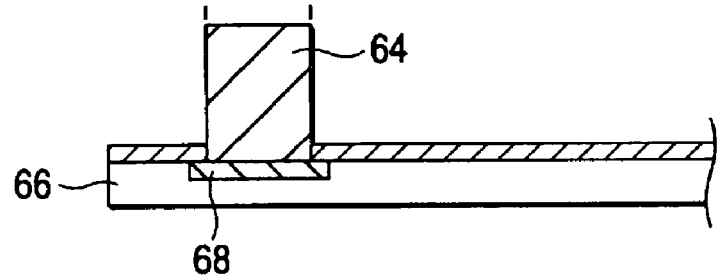

FIGS. 13A and 13B are partial schematic diagrams illustrating the metal post interconnect of a semiconductor device in a second embodiment; FIG. 13A is a partial plan view, and FIG. 13B is a partial cross-sectional view. FIGS. 14A and 14B are partial schematic diagrams illustrating the metal post interconnect of a traditional semiconductor device; FIG. 14A is a partial plan view, and FIG. 14B is a partial cross-sectional view.

In the second embodiment, as shown in FIGS. 13A and 13B, a first rewiring layer 16 (second wiring) is formed so as to cover adjacent pad electrodes 12 of a 1st semiconductor chip 10, and a first metal post interconnect 18 is formed on the first rewiring layer 16 so as to position the central axis near the center of the surface of the first rewiring layer 16. The configurations other than this are the same as those in the first embodiment, thus omitting the description.

Generally, as shown in FIGS. 14A and 14B, a metal post interconnect 64 is formed based on a pad electrode 68 of a semiconductor chip 66, but the post diameter needs to be reduced when the base area is small. Thus, a desired height cannot be obtained. When the metal post interconnect cannot be obtained at the desired height, a 2nd semiconductor chip 20 cannot be mounted. The metal post interconnect can be increased in the post diameter by expanding the base area, the height of the metal post interconnect can be raised in proportion to the post diameter, and the metal post interconnect can be more raised and strengthened by increasing the post diameter. Additionally, when the rewiring layer is formed in the portion other than the area for forming the pad electrodes to expand the base area, a problem arises that the space to mount the 2nd semiconductor chip 20 is narrowed.

Then, in the embodiment, the first rewiring layer 16 is formed so as to cover the adjacent pad electrodes 12 of the 1st semiconductor chip 10, which expands the base area for obtaining the height of the first metal post interconnect 18 required to mount the 2nd semiconductor chip 20 and secures the space to mount the 2nd semiconductor chip 20. The first metal post interconnect 18 is formed on the first rewiring layer 16 so as to position the central axis near the center of the surface of the first rewiring layer 16, which allows the post diameter to be increased and the realization of forming an excellent multi-chip.

Third Embodiment

Figure 15A:
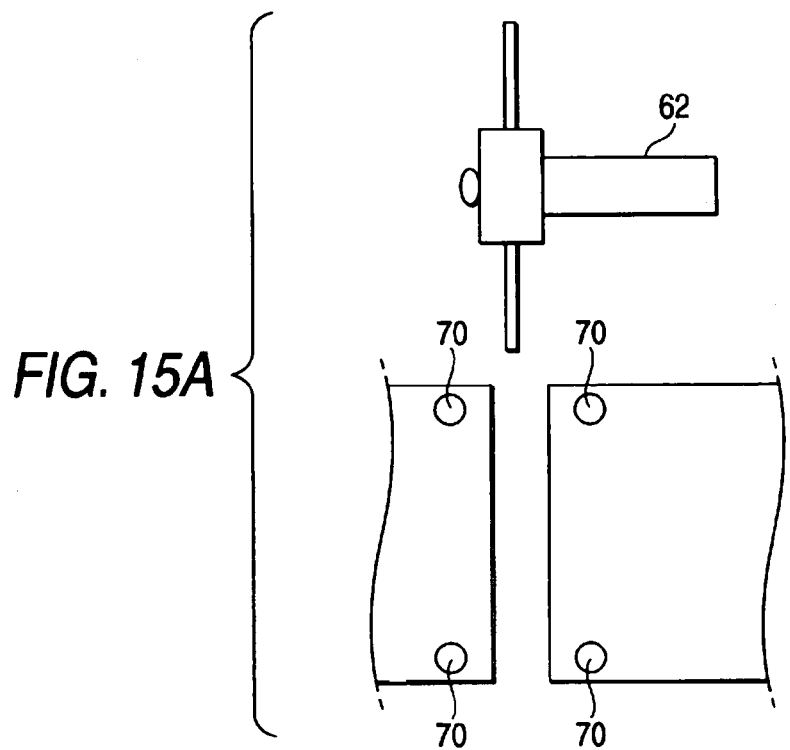
FIGS. 15A and 15B are schematic diagrams illustrating the structure of a semiconductor device in a third embodiment.
Figure 15B:
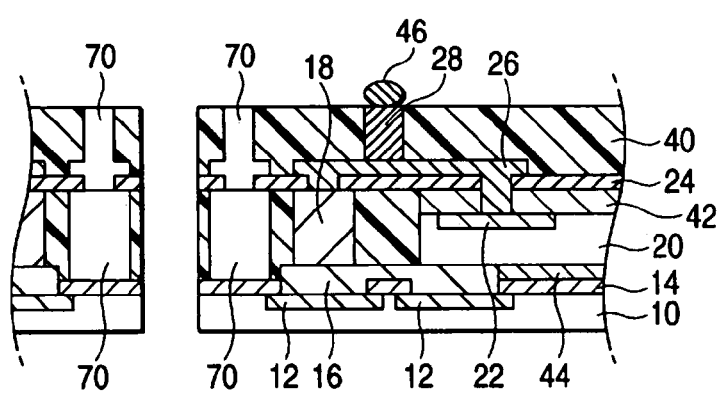

FIGS. 15A and 15B are schematic diagrams illustrating the structure of a semiconductor device in a third embodiment; FIG. 15A is a plan view, and FIG. 15B is a cross-sectional view.

In a semiconductor device 100 shown in FIGS. 15A and 15B, scribing line recognition posts 70 are formed at four corners on a 1st semiconductor chip 10 as exposed from an encapsulating resin 40, and the device is separated into pieces by a scribe blade 62, for example, along the scribing line recognition posts 70. For example, the scribing line recognition posts 70 can be formed as similar to the metal post interconnects 18 and 28. The other configurations are the same as those in the second embodiment, thus omitting the description.

Generally, when an inexpensive, opaque resin is used as the encapsulating resin 40, the scribing line (grid line) of the 1st semiconductor chip 10 cannot be observed and scribing (separating the device into pieces) is impossible. Therefore, an expensive, transparent resin is used to recognize the scribing line (grid line) of the 1st semiconductor chip 10 for separating the device into pieces.

Then, in the embodiment, the scribing line recognition posts 70 are formed on the 1st semiconductor chip 10, and the device is separated into pieces along the scribing line recognition posts 70. Therefore, the inexpensive, opaque resin can be used as the encapsulating resin to allow cost reductions.

Furthermore, the form of layering two semiconductor chips is shown in the embodiment, but the scribing line recognition posts 70 can be utilized for recognizing the positions in dice bonding semiconductor chips including a 3rd semiconductor chip or more. Also, the inexpensive, opaque resin can be used as the encapsulating resin to allow the semiconductor chips including the 3rd semiconductor chip or more to be layered with cost reductions.

Moreover, the form that the scribing line recognition posts 70 are formed at the four corners of the 1st semiconductor chip 10 is described in the embodiment, but the scribing line recognition posts 70 can be formed freely. For example, when they are formed in the periphery of a wafer formed with devices to be the 1st semiconductor chip 10, they function for recognizing the scribing line.

Fourth Embodiment

Figure 16:
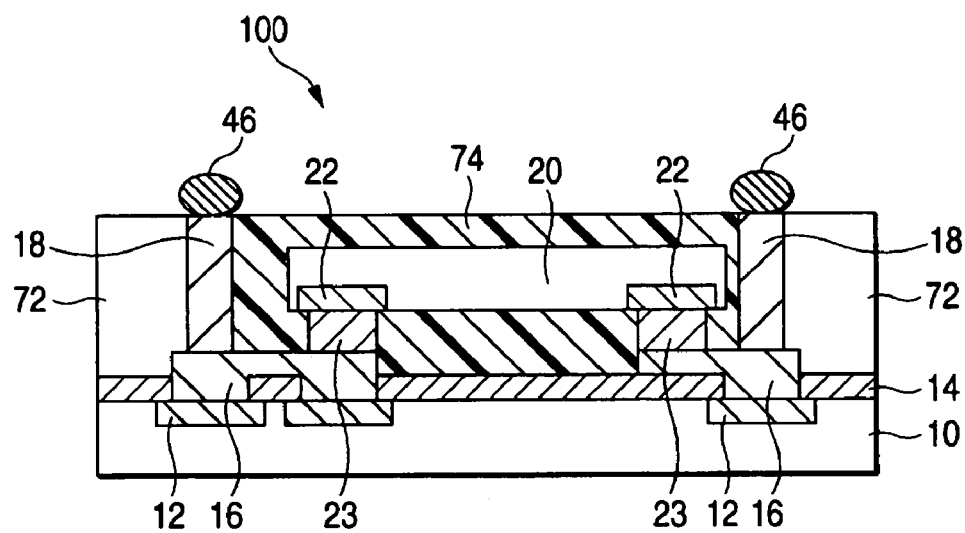
FIG. 16 is a cross-sectional view illustrating the structure of a semiconductor device in a fourth embodiment.
Figure 17:
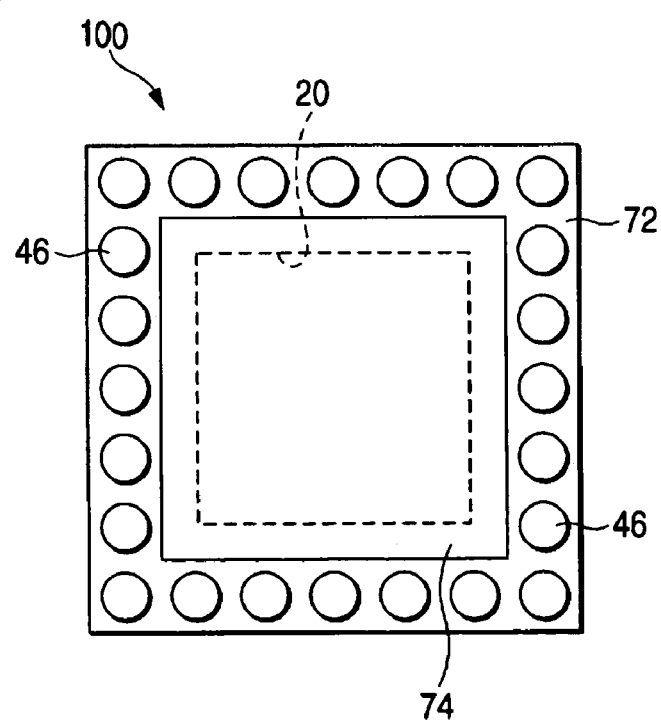
FIG. 17 is a plan view illustrating the structure of the semiconductor device in the fourth embodiment.

FIG. 16 is a cross-sectional view illustrating the structure of a semiconductor device in a fourth embodiment. FIG. 17 is a plan view illustrating the structure of the semiconductor device in the fourth embodiment. FIGS. 18A to 28K are cross-sectional views illustrating fabrication methods of the semiconductor device in the fourth embodiment. In addition, FIGS. 18A to 21O depict an example of using a negative resist material as a first encapsulating resin, and FIGS. 22a to 28K depict an example of using a positive resist material as a first encapsulating resin.

In a semiconductor device 100 shown in FIGS. 16 to 17, a 2nd semiconductor chip 20 (second semiconductor chip) formed with integrated circuits (not shown) is mounted on a 1st semiconductor chip 10 (first semiconductor, chip) formed with integrated circuits (not shown) as layered in the direction nearly orthogonal to the front side of the chip with the sides formed with integrated circuits facing each other.

The 1st semiconductor chip 10 has pad electrodes 12 electrically connected to the integrated circuit thereon, and has an insulating film 14 formed in the portions other than the pad electrodes 12. The 1st semiconductor chip 10 is formed with a rewiring layer 16 for electrically connecting the pad electrodes 12 each other or to the integrated circuits of a 2nd semiconductor chip 20, and a part of the rewiring layer 16 is formed to cover the adjacent pad electrodes 12. Then, metal post interconnects 18 for electrically connecting to external terminals are formed on the rewiring-layer 16. The periphery of the metal post interconnects 18 (first area) on the 1st semiconductor chip 10 is encapsulated with a resist material for disposing openings to form the metal post interconnects 18 as a first encapsulating resin 72.

The 2nd semiconductor chip 20 has pad electrodes 22 electrically connected to the integrated circuits thereon, and also has bump electrodes 23 electrically connected to the pad electrodes 22. The 2nd semiconductor chip 20 is mounted on and electrically connected to the rewiring layer 16 on the 1st semiconductor chip 10 as the side formed with integrated circuits faces thereto. The periphery (second area)

of the mounted 2nd semiconductor chip 20 is encapsulated with a second encapsulating resin 74 such as a molding resin.

Then, ball electrodes 46 being external terminals are formed on the tip ends of the metal post interconnects 18.

Hereafter, one example of a fabrication method of the semiconductor device 100 shown in FIGS. 16 to 17 will be described.

Figure 18A:
FIGS. 18A to 18F are cross-sectional views illustrating a fabrication method of the semiconductor device in the fourth embodiment.
Figure 18B:
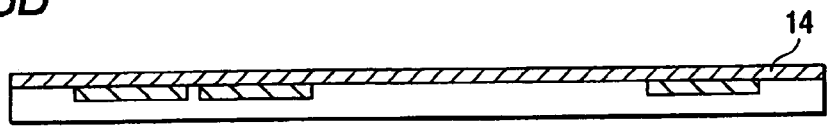
Figure 18C:
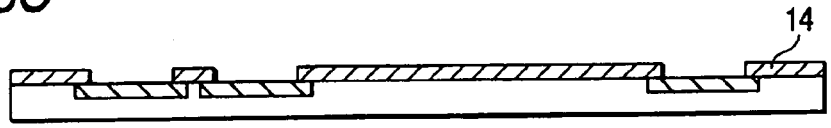
Figure 18D:
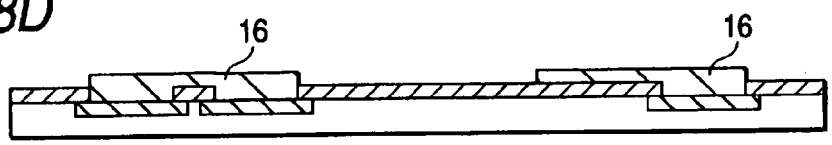

First, a wafer 48 formed with devices to be the 1st semiconductor chip 10 is prepared (FIG. 18A). The insulating film 14 (a polyimide film, for example) is coated by spin coating on the wafer 48 where a passivation film of the pad electrodes 12 is removed (FIG. 18B). To have contact with the pad electrodes 12, openings are formed in the insulating film 14 by mask exposure and etching (FIG. 18C). The rewiring layer 16 (for example, Cu interconnect) is formed as the base for forming the connections of the 2nd semiconductor chip 20, interconnects between the pad electrodes, and the first metal post interconnects 18 by sputtering or plating (FIG. 18D).

Figure 18E:
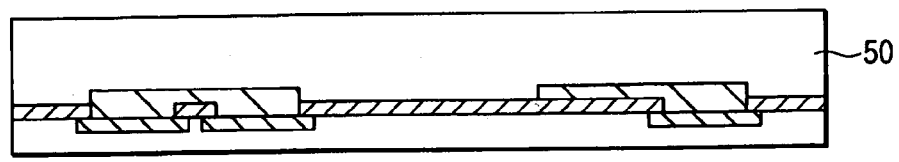
Figure 18F:
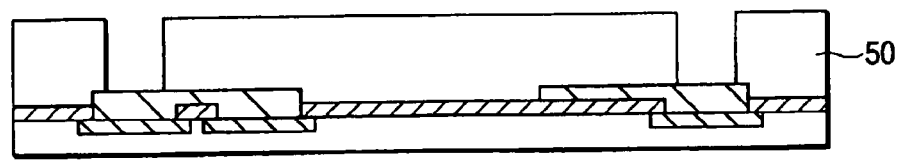
Figure 19G:
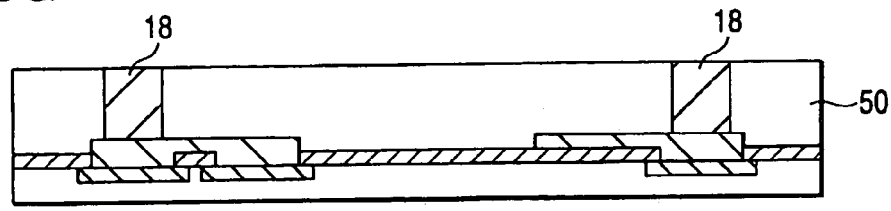
FIGS. 19G to 19J are cross-sectional views illustrating the fabrication method of the semiconductor device in the fourth embodiment.
Figure 19H:
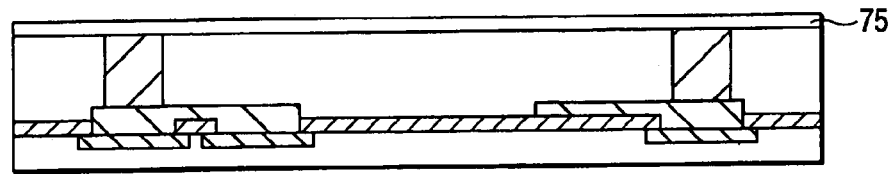
Figure 19I:
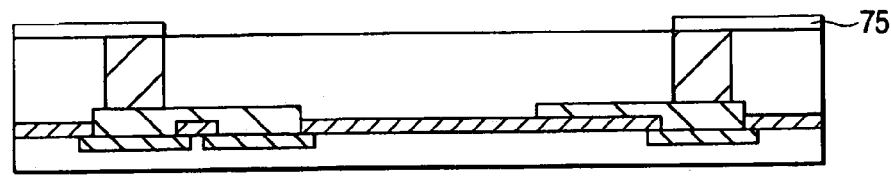
Figure 19J:
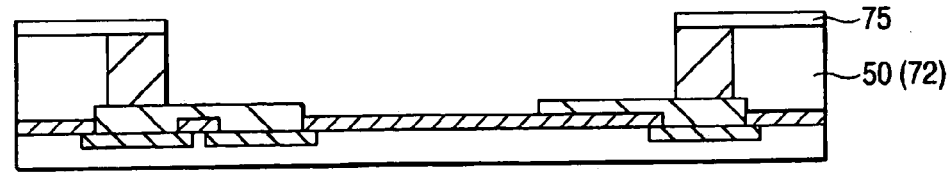

Subsequently, to form the metal post interconnects 18, a negative resist 50 (first encapsulating resin:negative resist material dry film) is coated over the wafer 48 (FIG. 18E). Openings for forming the metal post interconnects 18 are formed by mask exposure and etching (FIG. 18F). The metal post interconnects 18 (for example, Cu interconnect) are formed by plating (FIG. 19G). A conductive layer 75 (for example, metal plating such as Cu) is formed on the wafer 48 by plating (FIG. 19H). The area (second area) surrounded by the metal post interconnects 18 (first area) is opened in the conductive layer 75 by resist coating, mask exposure and etching, and a mask for removing the first encapsulating resin 72 (resist) is formed for securing the space to mount the 2nd semiconductor chip (FIG. 19I). The first encapsulating resin 72 is removed by etching (FIG. 19J). Here, since the mask is formed on the conductive layer 75, the resist 50 (the first encapsulating resin 72) to be removed is left in the periphery of the metal post interconnects 18 as the first encapsulating resin 72 and the area surrounded by the encapsulating resin 72 is removed to secure the space to mount the 2nd semiconductor chip.

Figure 20K:
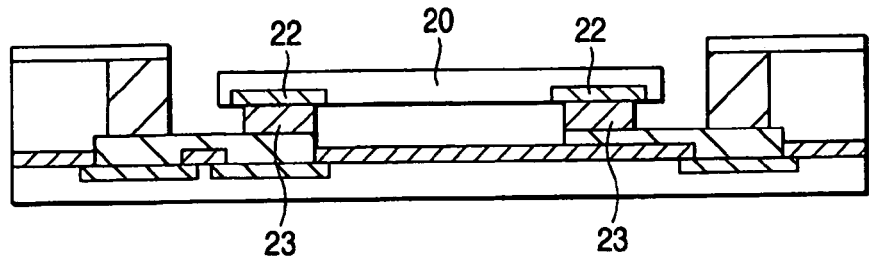
FIGS. 20K to 20N are cross-sectional views illustrating the fabrication method of the semiconductor device in the fourth embodiment.
Figure 20L:
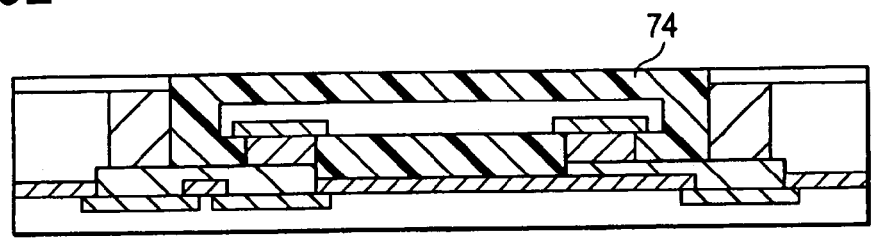
Figure 20M:
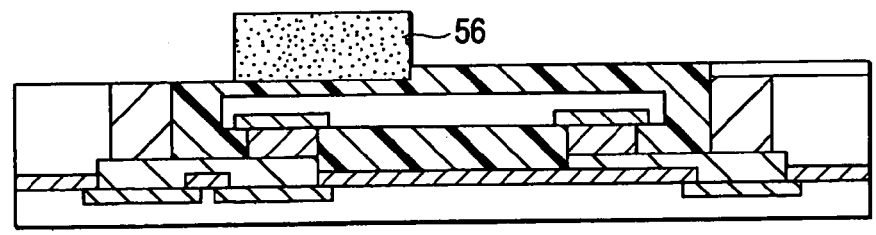

Then, the heated 2nd semiconductor chip 20 with the bump electrodes 23 is picked up by using a tool such as a flat collet for dice bonding with the use of ultrasonic waves and thermal reaction (FIG. 20K). The first encapsulating resin 72 is used as a mold member, an opaque resin such as a molding resin is coated from the top of the wafer 48 and then is cured, and the periphery of the 2nd semiconductor chip 20 is encapsulated with the resin as the second encapsulating resin 74 (FIG. 20L).

Figure 20N:
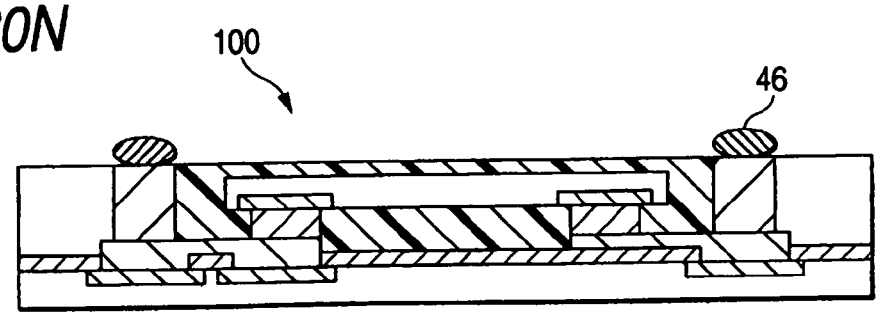
Figure 21O:
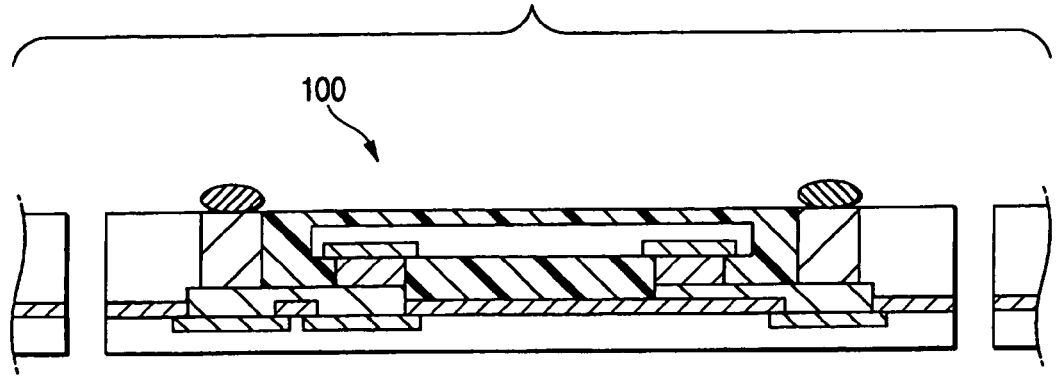
FIG. 21O is a cross-sectional view illustrating the fabrication method of the semiconductor device in the fourth embodiment.

Subsequently, to expose the metal post interconnects 18 buried in the first encapsulating resin 72 outside, the front side is ground by cutting from the top of the wafer 48 with a grinder 56 (a cutting tool, grindstone, and buff) (FIG. 20M) The ball electrodes 46 (solder balls) are formed on the tip ends of the exposed metal post interconnects 18 as external terminals by solder printing (FIG. 20N). Then, after tested, the wafer is separated into pieces by scribing to obtain the semiconductor device 100 (FIG. 21O).

Hereafter, another example of the fabrication method of the semiconductor device 100 shown in FIGS. 16 to 17 will be described.

Figure 22A:
FIGS. 22A to 22F are cross-sectional views illustrating a fabrication method of the semiconductor device in the fourth embodiment.
Figure 22B:
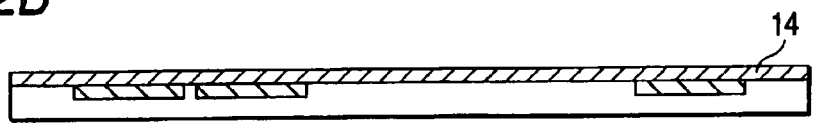
Figure 22C:
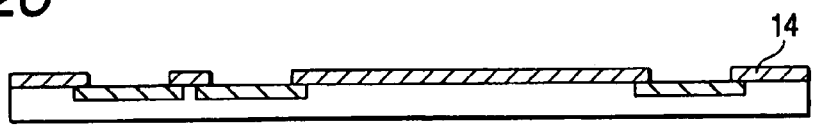
Figure 22D:
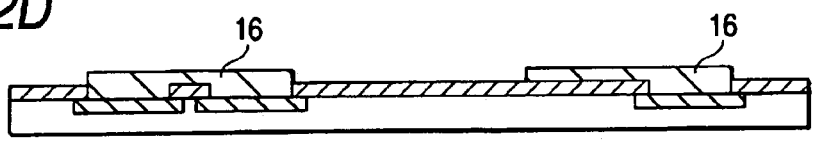

First, a wafer 48 formed with devices to be a 1st semiconductor chip 10 is prepared (FIG. 22A). An insulating film 14 (a polyimide film, for example) is coated by spin coating on the wafer 48 where a passivation film of pad electrodes 12 is removed (FIG. 22B). To have contact with the pad electrodes 12, openings are formed in the insulating film 14 by mask exposure and etching (FIG. 22C). A rewiring layer 16 (for example, Cu interconnect) is formed as the base for forming the connections of a 2nd semiconductor chip 20, interconnects between the pad electrodes, and first metal post interconnects 18 by sputtering or plating (FIG. 22D).

Figure 22E:
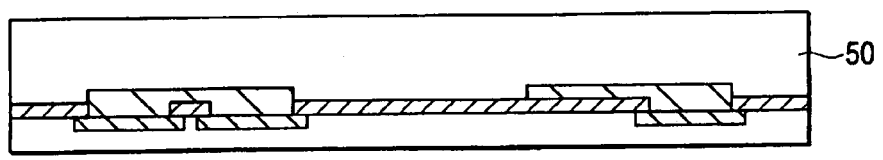
Figure 22F:
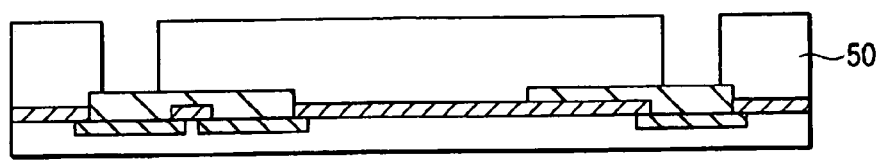
Figure 23G:
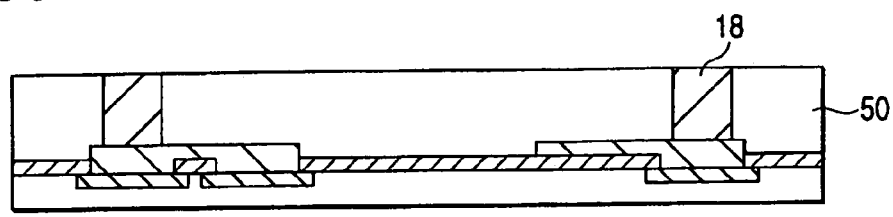
FIGS. 23G to 23I are cross-sectional views illustrating the fabrication method of the semiconductor device in the fourth embodiment.
Figure 23H:
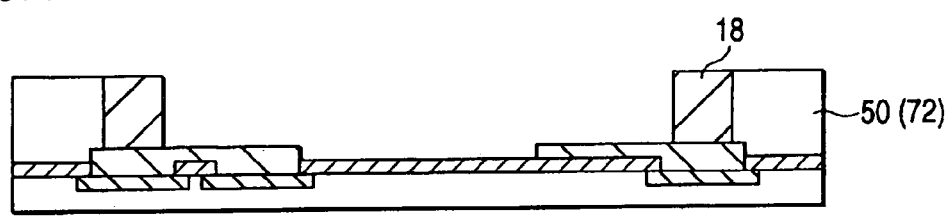

Subsequently, to form the metal post interconnects 18, a negative resist 50 (first encapsulating resin: positive resist material dry film) is coated over the wafer 48 (FIG. 22E). Openings for forming the metal post interconnects 18 are formed by mask exposure and etching (FIG. 22F). The metal post interconnects 18 (for example, Cu interconnect) are formed by plating (FIG. 23G). The area (second area) surrounded by the area (first area) where the metal post interconnects 18 are placed is removed by etching in a first encapsulating resin 72 (FIG. 23H). Here, a resist 50 is left in the periphery of the metal post interconnects 18 as the first encapsulating resin 72, the area surrounded by the first encapsulating resin 72 is removed, and the space to mount the 2nd semiconductor chip is secured.

Figure 23I:
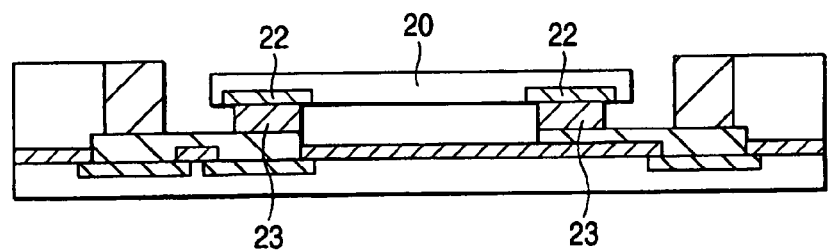
Figure 24J:
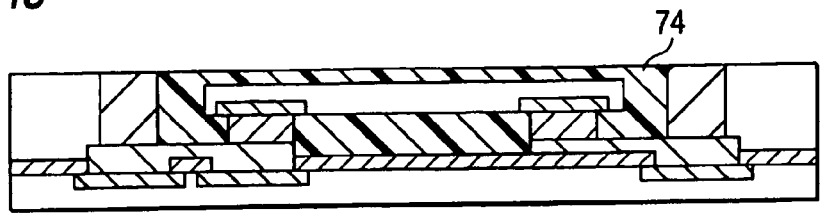
FIGS. 24J to 24M are cross-sectional views illustrating the fabrication method of the semiconductor device in the fourth embodiment.

Then, the heated 2nd semiconductor chip 20 with the bump electrodes 23 is picked up by using a tool such as a flat collet for dice bonding with the use of ultrasonic waves and thermal reaction (FIG. 23I). The first encapsulating resin 72 is used as a mold member, an opaque resin such as a molding resin is coated from the top of the wafer 48, and then it is cured to encapsulate the periphery of the 2nd semiconductor chip 20 with the resin as a second encapsulating resin 74 (FIG. 24J).

Figure 24K:
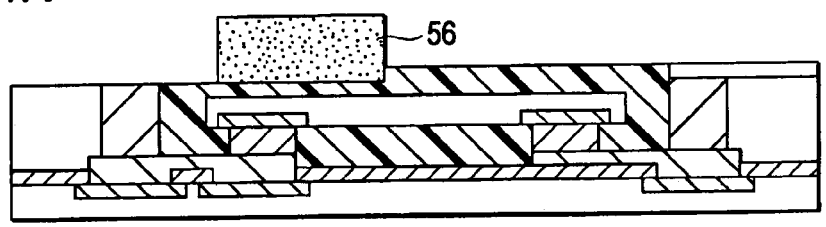
Figure 24L:
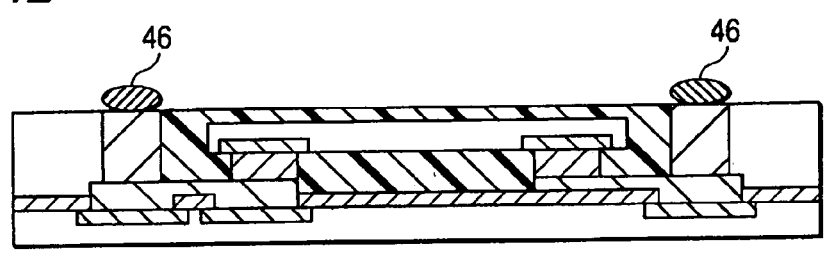
Figure 24M:
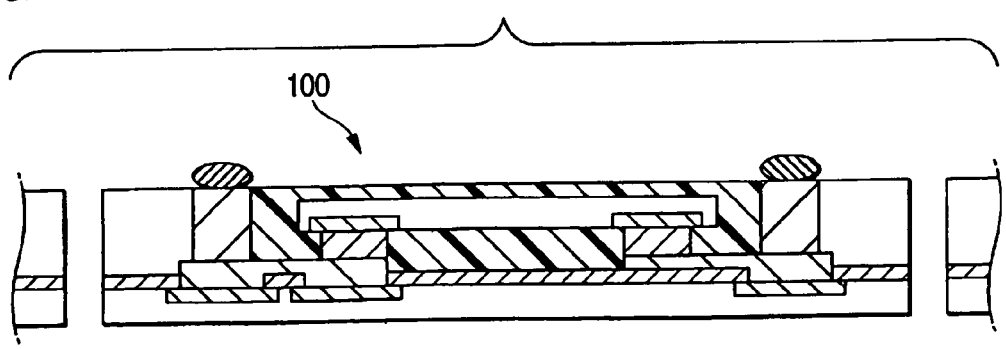

Subsequently, to expose the metal post interconnects 18 buried in the first encapsulating resin 72 outside, the front side is ground by cutting from the top of the wafer 48 with a grinder 56 (a cutting tool, grindstone, and buff) (FIG. 24K). Ball electrodes 46 (solder balls) are formed at the tip ends of the exposed metal post interconnects 18 as external terminals by solder printing (FIG. 24L). Then, after tested, the wafer is separated into pieces by scribing to obtain the semiconductor device 100 (FIG. 24M).

In the embodiment, the periphery of the metal post interconnects 18 (first area) of the 1st semiconductor chip 10 is encapsulated with the resist material for disposing the openings for forming the metal post interconnects 18 as it is as the first encapsulating resin 72, thereby preventing peels of the metal post interconnects 18 generated in resin encapsulation. Additionally, in mounting the second semiconductor chip and encapsulating the periphery (second area) with the second encapsulating resin 74, the first encapsulating resin 72 serves as the mold member (a member for blocking the second encapsulating resin 74). Therefore, the periphery of the 2nd semiconductor chip 20 can be encapsulated with the resin by a simple facility to allow cost reductions.

Furthermore, the examples of using the negative and positive resist materials as the first encapsulating resin 72 are shown in the embodiment. However, the fabrication method of using the positive resist material does not need to form the conductive layer 75, and thus the fabrication costs are more reduced than those in the fabrication method of using the negative resist material.

Fifth Embodiment

Figure 25:
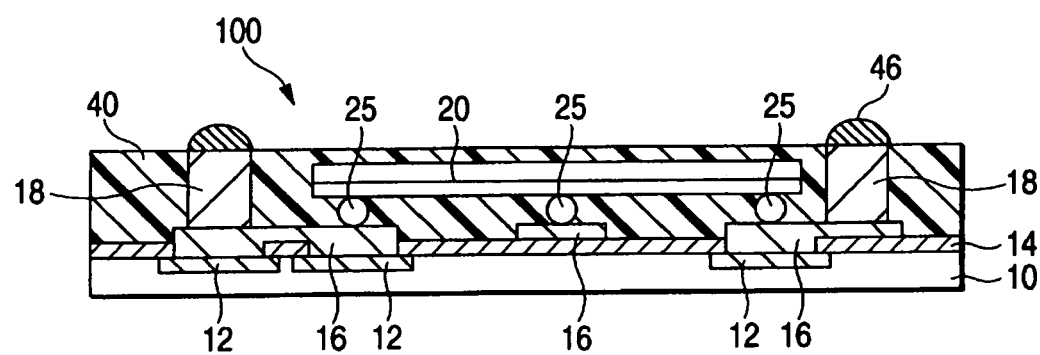
FIG. 25 is a cross-sectional view illustrating the structure of a semiconductor device in a fifth embodiment.

FIG. 25 is a cross-sectional view illustrating the structure of a semiconductor device in a fifth embodiment. FIGS. 26A to 28K are cross-sectional views illustrating a fabrication method of the semiconductor device in the fifth embodiment.

In a semiconductor device 100 shown in FIG. 25, a chip size package type 2nd semiconductor chip 20 (second semiconductor chip) formed with integrated circuits (not shown) and disposed with ball electrodes 25 electrically connected to the integrated circuits is mounted on a 1st semiconductor chip 10 (first semiconductor chip) formed with integrated circuits (not shown) as layered in the direction nearly orthogonal to the front side of the chip with the sides formed with integrated circuits facing each other, and they are encapsulated with an encapsulating resin 40.

The 1st semiconductor chip 10 has pad electrodes 12 electrically connected to the integrated circuits thereon, and has an insulating film 14 in the portions other than the pad electrodes 12. The 1st semiconductor chip 10 is formed with a rewiring layer 16 for electrically connecting the pad electrodes 12 each other or to the integrated circuits of the 2nd semiconductor chip 20 (ball electrodes 25), and a part of the rewiring layer 16 is formed to cover the adjacent pad electrodes 12. Then, metal post interconnects 18 for electrically connecting to external terminals are formed on the rewiring layer 16.

As the 2nd semiconductor chip 20, an existing CSP, not shown, is used in which the side having integrated circuit is encapsulated with a resin and ball electrodes 25 (projecting electrodes) electrically connected to the integrated circuit and projecting from the encapsulating resin are disposed as external terminals. Additionally, as the 2nd semiconductor chip 20, a CSP is acceptable that has the configuration in which an existing CSP is rewired to rearrange ball electrodes 25. The 2nd semiconductor chip 20 is mounted on and electrically connected to the rewiring layer 16 on the 1st semiconductor chip 10 as the side formed with integrated circuits faces thereto.

Then, ball electrodes 46 (solder balls) being external terminals are formed at the tip ends of the metal post interconnects 18.

Hereafter, one example of a fabrication method of the semiconductor device 100 shown in FIG. 25 will be described.

Figure 26A:
FIGS. 26A to 26F are cross-sectional views illustrating a fabrication method of the semiconductor device in the fifth embodiment.
Figure 26B:
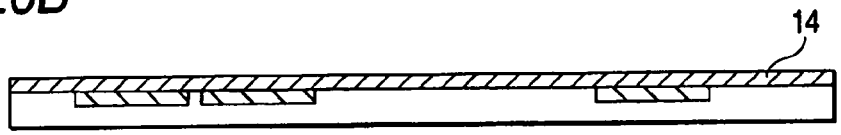
Figure 26C:
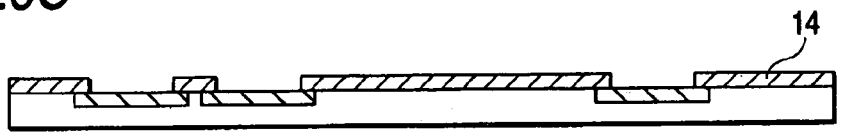
Figure 26D:
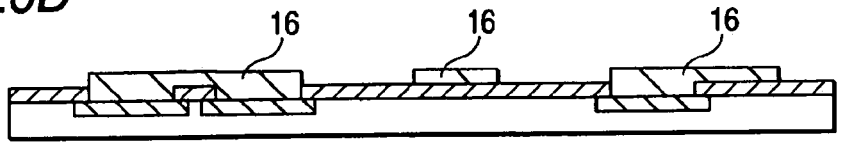

First, a wafer 48 formed with devices to be the 1st semiconductor chip 10 is prepared (FIG. 26A). The insulating film 14 (a polyimide film, for example) is coated on the wafer 48 where a passivation film of the pad electrodes 12 is removed (FIG. 26B). To have contact with the pad electrodes 12, openings are formed in the insulating film 14 by mask exposure and etching (FIG. 26C). The rewiring layer 16 (for example, Cu interconnect) is formed as the base for forming the connections of the 2nd semiconductor chip 20, interconnects between the pad electrodes, and the first metal post interconnects 18 by sputtering or plating (FIG. 26D).

Figure 26E:
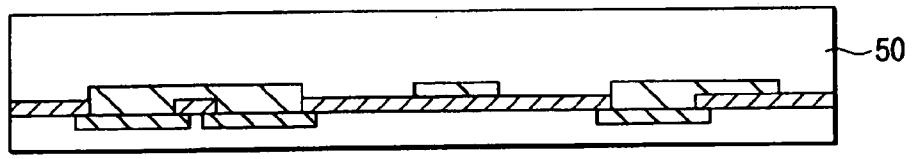
Figure 26F:
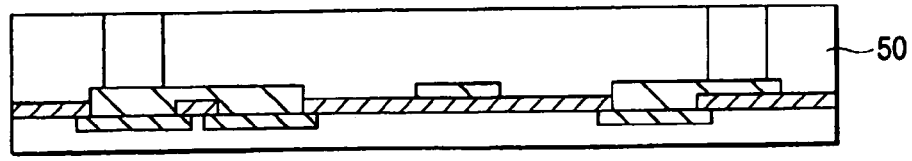
Figure 27G:
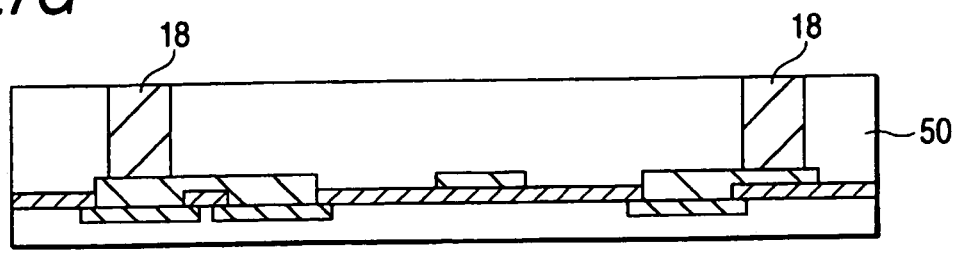
FIGS. 27G to 27J are cross-sectional views illustrating the fabrication method of the semiconductor device in the fifth embodiment.
Figure 27H:
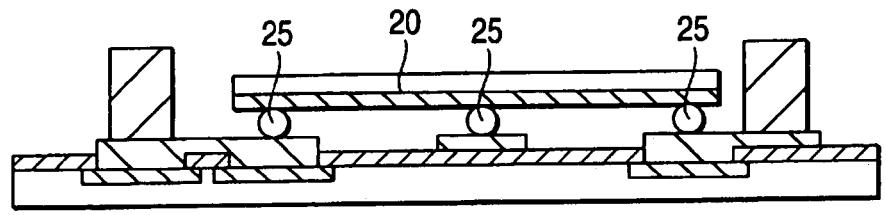

Then, to form the metal post interconnects 18, a resist 50 is coated over the wafer 48 (FIG. 26E). Openings for forming the metal post interconnects 18 are formed by mask exposure and etching (FIG. 26F). The metal post interconnects 18 (for example, Cu interconnect) are formed by plating (FIG. 27G). After the resist 50 is removed for cleaning, ball electrodes 25 of an existing CSP are abutted on the rewiring layer 16 of the wafer 48 as the 2nd semiconductor chip 20, and the chip is thermally welded by reflow for mounting (FIG. 27H).

Figure 27I:
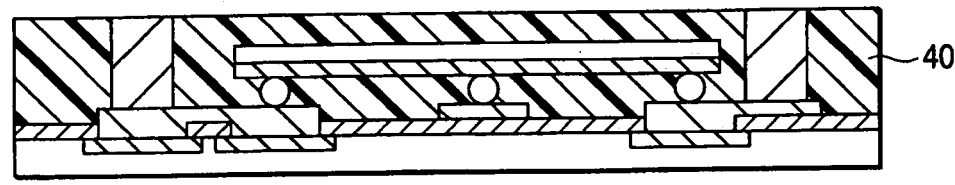
Figure 27J:
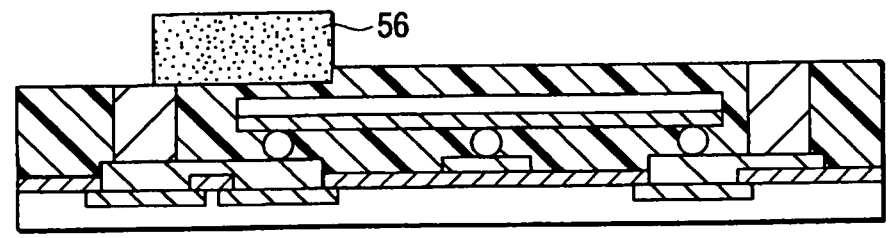
Figure 28K:
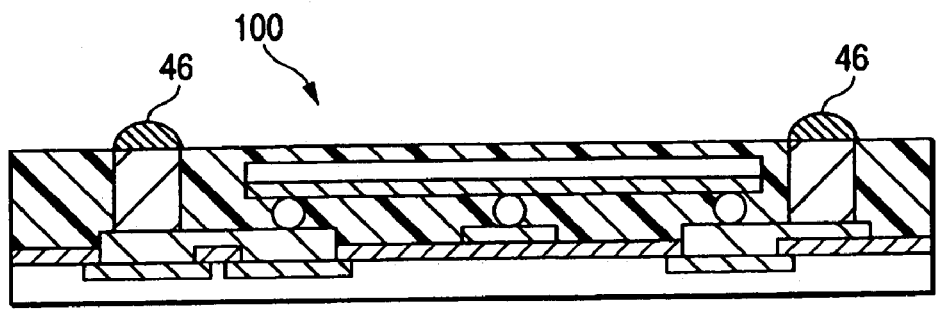
FIG. 28K is a cross-sectional view illustrating the fabrication method of the semiconductor device in the fifth embodiment.

Subsequently, the periphery (circumference) of the wafer 48 is surrounded by a mold, the liquid encapsulating resin 40 is coated from the top of the wafer 48, and then it is cured for resin encapsulation (FIG. 27I). To expose the metal post interconnects 18 buried in the encapsulating resin 40 outside, the front side is ground by cutting from the top of the wafer 48 with a grinder 56 (a cutting tool, grindstone, and buff) (FIG. 27(J)). The ball electrodes 46 (solder balls) are formed at the tip ends of the exposed metal post interconnects 18 as external terminals by solder printing. Then, after tested, the wafer is separated into pieces by scribing to obtain the semiconductor device 100 (FIG. 28K).

In the embodiment, the chip size package type 2nd semiconductor chip 20 (second semiconductor chip) formed with the integrated circuits (not shown) and disposed with the ball electrodes 25 electrically connected to the integrated circuits is mounted as layered in the direction nearly orthogonal to the front side of the chip with the sides formed with integrated circuits facing each other. The pitch width of the pad (the ball electrode 25) is more widened (a few tenths of a millimeter) than the case of using a bump type semiconductor having the narrow pad pitch (10 to 100 µm) as the 2nd semiconductor chip 20, and a degree of flexibility in rewiring of the 1st semiconductor chip 10 is increased. In addition, in the embodiment, the existing CSP can be formed into a multi-chip easily. Furthermore, when the CSP having the configuration in which the existing CSP is rewired and the ball electrodes 25 are rearranged is used as the 2nd semiconductor chip 20, a degree of flexibility in rewiring the 1st semiconductor chip 10 is increased.

Sixth Embodiment

Figure 29A:
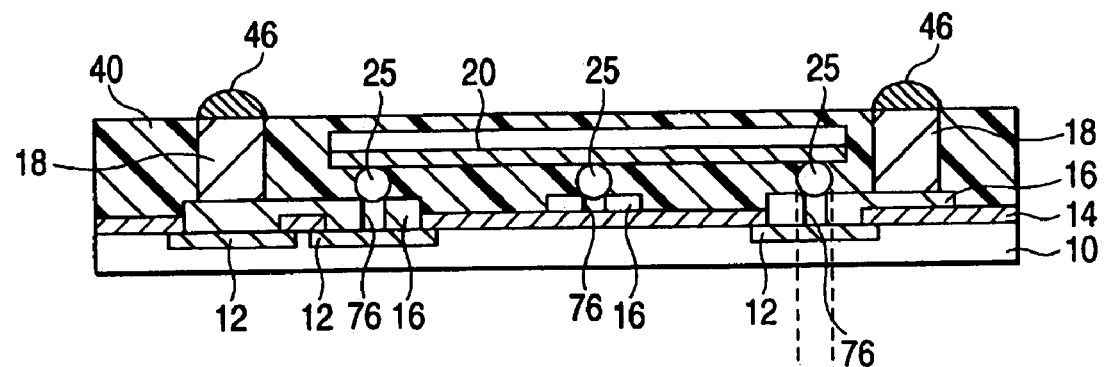
FIG. 29A is a cross-sectional view illustrating the structure of a semiconductor device in a sixth embodiment.
Figure 29B:
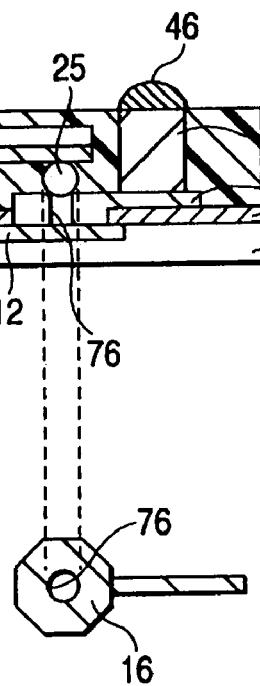
FIG. 29B is a plan view illustrating a rewiring layer of the semiconductor device in the sixth embodiment.

FIG. 29A is a cross-sectional view illustrating the structure of a semiconductor device in a sixth embodiment, and FIG. 29B is a plan view illustrating a rewiring layer of the semiconductor device in the sixth embodiment.

In a semiconductor device 100 shown in FIG. 29A, opening parts 76 are disposed in a rewiring layer 16 of a 1st semiconductor chip 10, and a 2nd semiconductor chip is mounted as ball electrodes 25 are placed at the opening parts 76. As shown in FIG. 29B, the opening part 76 of the rewiring layer 16 penetrates through the under layer but does not break the rewiring layer 16. The configurations other than this are the same as those in the fifth embodiment, thus omitting the description.

As shown in the fifth embodiment, the rewiring layer 16 of the 1st semiconductor chip 10 is connected to the ball electrodes 25 of the 2nd semiconductor chip 20 by reflow. In the reflow process, the semiconductor device is vibrated, and the vibrations cause the rewiring layer 16 of the 1st semiconductor chip 10 to be shifted from the ball electrodes 25 of the 2nd semiconductor chip 20, sometimes generating connection failure.

Then, in the embodiment, the opening parts 76 are disposed in the rewiring layer 16 formed on the 1st semiconductor chip 10, and the 2nd semiconductor chip 20 is mounted as the ball electrodes 25 are placed at the opening parts 76 in the rewiring layer 16. Therefore, the ball electrodes 25 are engaged with the opening parts 76, and displacement in position caused by the vibrations is prevented in the reflow process, and connection failure is prevented.

Seventh Embodiment

Figure 30:
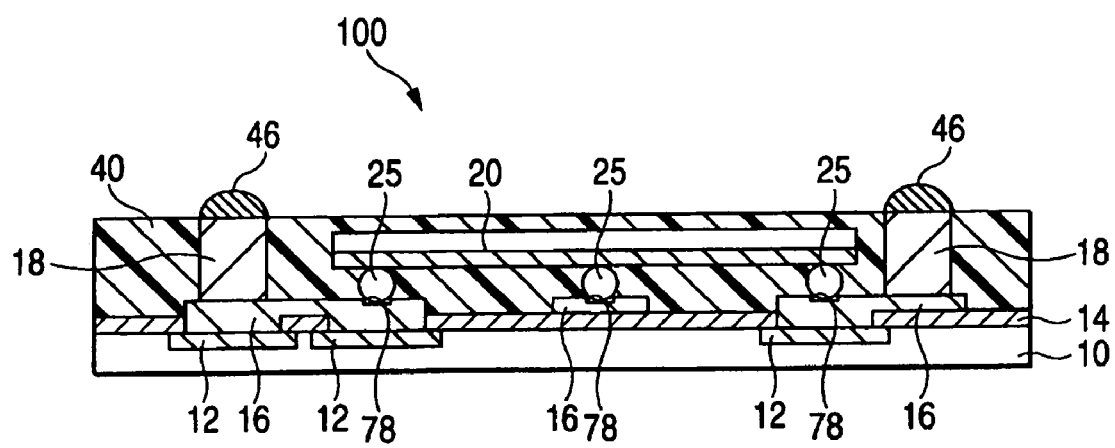
FIG. 30 is a cross-sectional view illustrating the structure of a semiconductor device in a seventh embodiment.

FIG. 30 is a cross-sectional view illustrating the structure of a semiconductor device in a seventh embodiment. FIGS. 31A to 34L are cross-sectional views illustrating a fabrication method of the semiconductor device in the seventh embodiment.

In a semiconductor device 100 shown in FIG. 30, recesses 78 rectangular in cross section are disposed in a rewiring layer 16 of a 1st semiconductor chip 10, and a 2nd semiconductor chip is mounted as ball electrodes 25 are placed at the recesses 78 rectangular in cross section. The configurations other than this are the same as those in the fifth embodiment, thus omitting the description.

Hereafter, one example of a fabrication method of the semiconductor device 100 shown in FIG. 30 will be described.

Figure 31A:
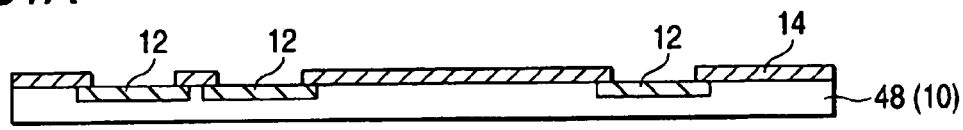
FIGS. 31A to 31D are cross-sectional views illustrating a fabrication method of the semiconductor device in the seventh embodiment.

First, a wafer 48 formed with devices to be the 1st semiconductor chip 10 is prepared, an insulating film 14 (a polyimide film, for example) is coated by spin coating on the wafer 48 where a passivation film of pad electrodes 12 is removed, and openings are formed in the insulating film 14 to have contact with the pad electrodes 12 by mask exposure and etching (FIG. 31A).

Figure 31B:
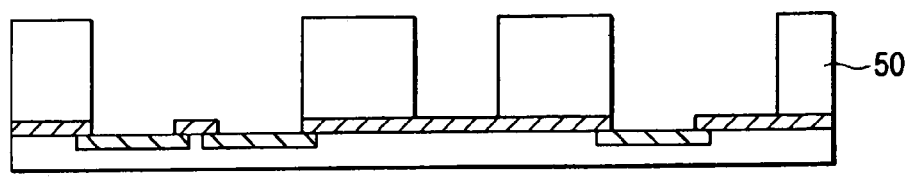
Figure 31C:
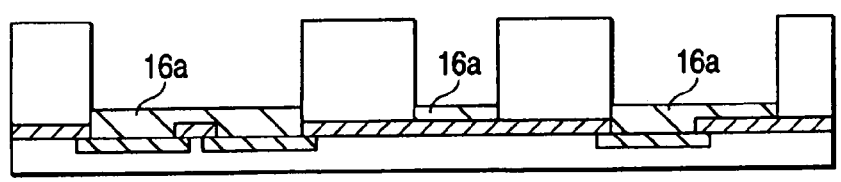
Figure 31D:
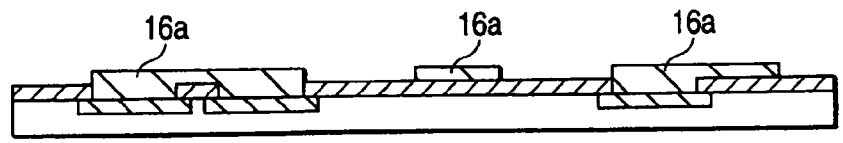
Figure 32E:
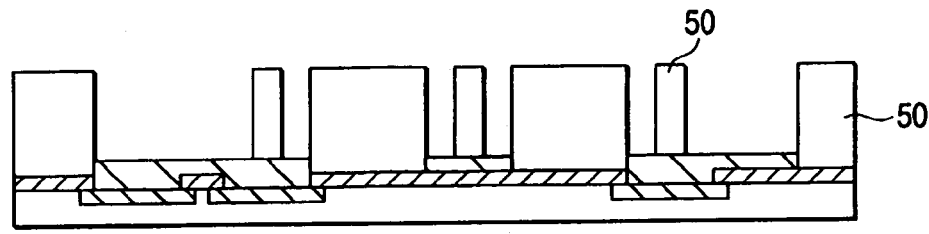
FIGS. 32E to 32H are cross-sectional views illustrating the fabrication method of the semiconductor device in the seventh embodiment.
Figure 32F:
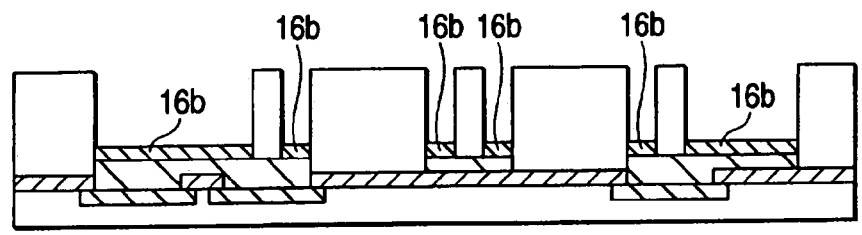
Figure 32G:
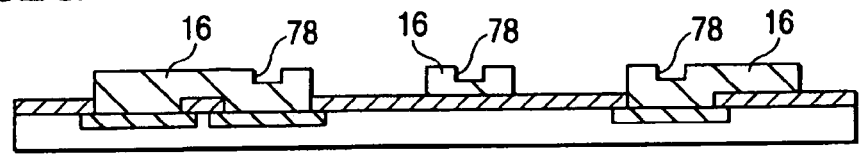

Subsequently, a rewiring layer 16 (for example, Cu interconnect) is formed as the base for forming the connections of the 2nd semiconductor chip 20, interconnects between the pad electrodes, and the first metal post interconnects 18. A resist 50 is first coated over the wafer 48, and openings for forming the rewiring layer 16 are formed in the resist 50 by mask exposure and etching (FIG. 31B). Then, a rewiring layer 16a of the first layer is formed by sputtering or plating (FIG. 31C). Subsequently, the resist 50 is removed (FIG. 31D). The resist 50 is again coated over the wafer 48, and openings for forming the rewiring layer 16 are formed in the resist 50 by mask exposure and etching (FIG. 32E). Here, openings are formed in the portions other than the portions corresponding to the recesses 78 in the rewiring layer 16a of the first layer. Then, a rewiring layer 16b of the second layer is formed by sputtering or plating (FIG. 32F). Subsequently, the resist 50 is removed (FIG. 32G). In this manner, the rewiring layer 16 formed with the recesses 78 is formed. In addition, the sectional form of the recess 78 in the rewiring layer 16 can be formed into a desired shape by repeating the operations from FIGS. 31B to 32G.

Figure 32H:
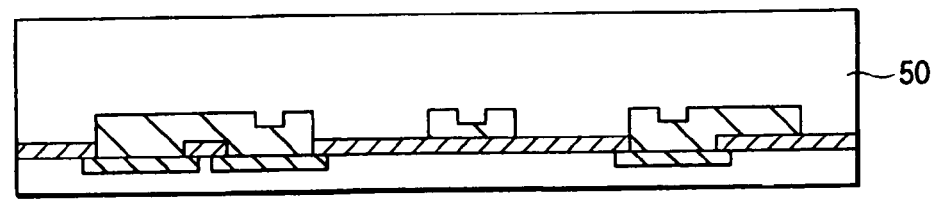
Figure 33I:
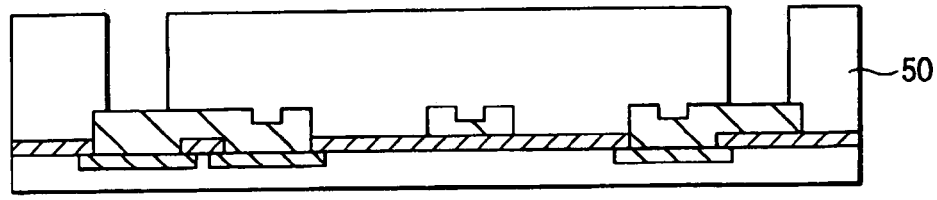
FIGS. 33I to 33K are cross-sectional views illustrating the fabrication method of the semiconductor device in the seventh embodiment.
Figure 33J:
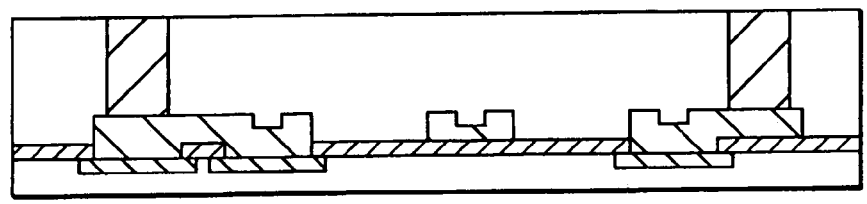
Figure 33K:
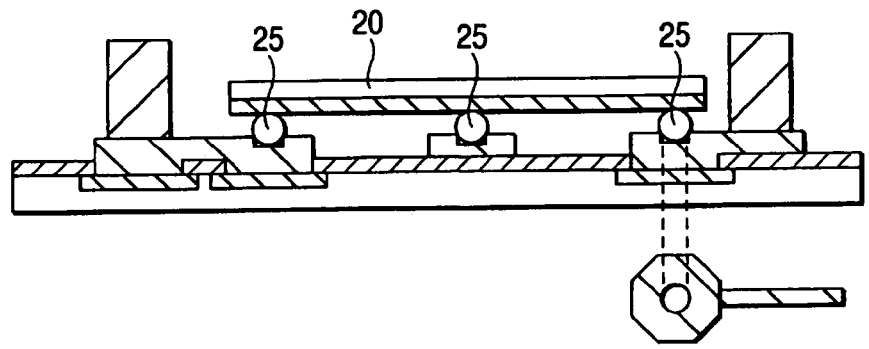

Subsequently, to form the metal post interconnects 18, the resist 50 is coated over the wafer 48 (FIG. 32H). Openings for forming the metal post interconnects 18 are formed by mask exposure and etching (FIG. 33I). The metal post interconnects 18 (for example, Cu interconnect) are formed by plating (FIG. 33 (J). The resist 50 is removed for cleaning, an existing CSP is a butted as the 2nd semiconductor chip 20 as the ball electrodes 25 are placed at the recesses 78 in the rewiring layer 16 of the wafer 48,and the chip is thermally welded by reflow for mounting (FIG. 33K).

Figure 34L:
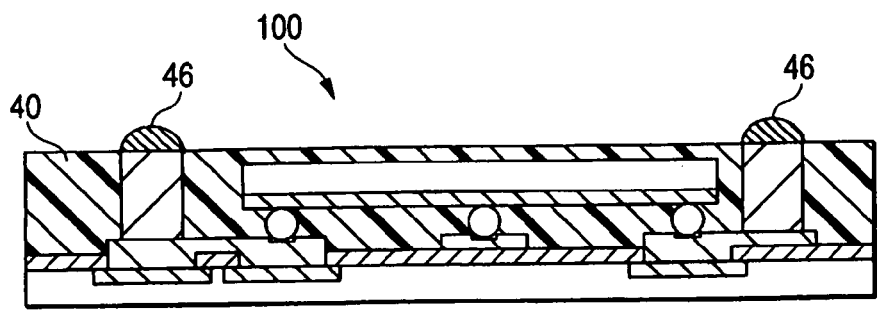
FIG. 34L is a cross-sectional view illustrating the fabrication method of the semiconductor device in the seventh embodiment.

After that, as similar to the fifth embodiment, the periphery (circumference) of the wafer 48 is surrounded by a mold, the liquid encapsulating resin 40 is coated from the top of the wafer 48, and then it is cured for resin encapsulation. To expose the metal post interconnects 18 buried in the encapsulating resin 40 outside, the front side is ground by cutting from the top of the wafer 48 with a grinder 56 (a cutting tool, grindstone, and buff). The ball electrodes 46 (solder balls) are formed at the tip ends of the exposed metal post interconnects 18 as external terminals by solder printing. Then, after tested, the wafer is separated into pieces by scribing to obtain the semiconductor device 100 (FIG. 34L).

In the sixth embodiment, when the under layer where the rewiring layer 16 is disposed is the insulating film 14, the ball electrodes 25 are connected to the rewiring layer 16 only through the inner walls of the opening parts 76 in the rewiring layer 16. Therefore, the reliability in joining the ball electrodes 25 to the rewiring layer 16 sometimes fails.

Then, in the embodiment, the recesses 78 are disposed in the rewiring layer 16 of the 1st semiconductor chip 10, and the 2nd semiconductor chip 20 is mounted as the ball electrodes 25 are placed at the recesses 78, thereby joining the ball electrodes 25 of the 2nd semiconductor chip throughout the bottom and the side walls (inner walls) of the recesses 78. Thus, the contact area is increased, and the reliability in joining the ball electrodes 25 to the rewiring layer 16 is improved. Therefore, in the embodiment, the displacement in position by the vibrations in the reflow process is prevented, and the connection failure is prevented more effectively.

Additionally, in the embodiment, the rewiring layer 16 is formed by sputtering or plating in two steps (or more steps as required), which allows the rewiring layer 16 having the recesses 78 to be formed easily.

Eighth Embodiment

Figure 35:
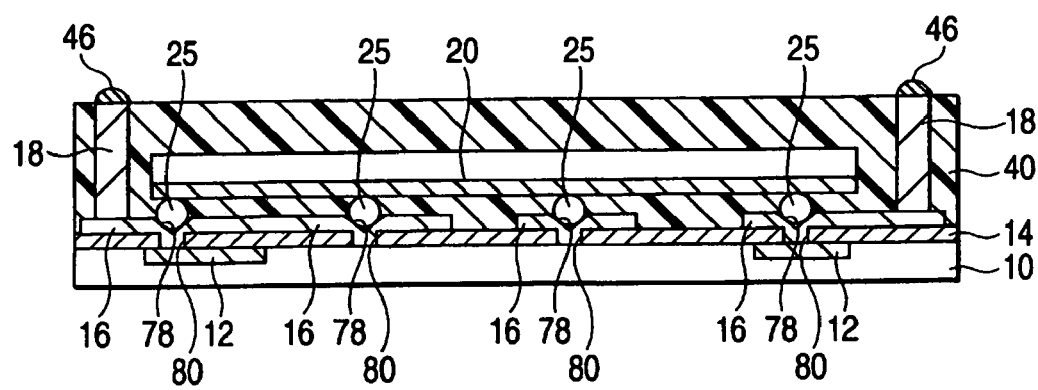
FIG. 35 is a cross-sectional view illustrating the structure of a semiconductor device in an eighth embodiment.

FIG. 35 is a cross-sectional view illustrating the structure of a semiconductor device in an eighth embodiment. FIGS. 36A to 36E are cross-sectional views illustrating a fabrication method of the semiconductor device in the eighth embodiment.

In a semiconductor device 100 shown in FIG. 35, opening parts 80 are formed in an insulating film 14 of a 1st semiconductor chip 10, a rewiring layer 16 is formed around the opening parts 80, recesses 78 (dents) are formed along the opening parts 80 in the rewiring layer 16, and a 2nd semiconductor chip is mounted as ball electrode 25 are placed at the recesses 78 (the opening parts 80 in the insulating film 14). The configurations other than this are the same as those in the fifth embodiment, thus omitting the description.

Hereafter, one example of a fabrication method of the semiconductor device 100 shown in FIG. 35 will be described.

Figure 36A:
FIGS. 36A to 36E are cross-sectional views illustrating a fabrication method of the semiconductor device in the eighth embodiment.
Figure 36B:
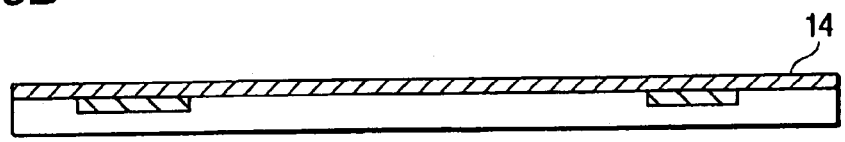
Figure 36C:
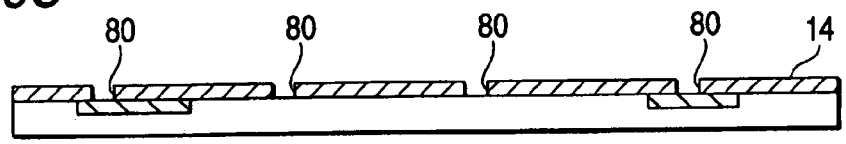

First, a wafer 48 formed with devices to be the 1st semiconductor chip 10 is prepared (FIG. 36A). The insulating film 14 (a polyimide film, for example) is coated by spin coating on the wafer 48 where a passivation film of pad electrodes 12 is removed (FIG. 36B). To have contact with the pad electrodes 12 and to dispose the recesses 78 in the rewiring layer 16, the opening parts 80 are formed in the insulating film 14 by mask exposure and etching (FIG. 36C).

Figure 36D:
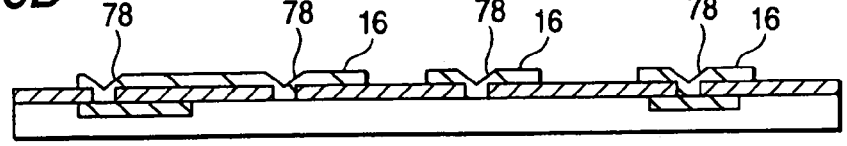

Subsequently, the rewiring layer 16 (for example, Cu interconnect) is formed as the base for forming the connections of the 2nd semiconductor chip 20, interconnects between the bad electrodes, and the first metal post interconnects 18 by sputtering or plating including the periphery of the opening parts 80 in the insulating film 14 (FIG. 36D). Here, in the rewiring layer 16, the recesses 78 (dents) are formed along the opening parts 80 in the insulating film 14.

After that, as shown in the fifth embodiment, to form the metal post interconnects 18, a resist 50 is coated over the wafer 48, and openings for forming the metal post interconnects 18 are formed by mask exposure and etching. The metal post interconnects 18 (for example, Cu interconnect) are formed by plating. After the resist 50 is removed for cleaning, an existing CSP is abutted as the 2nd semiconductor chip 20 as the ball electrodes 25 are placed at the recesses 78 in the rewiring layer 16 of the wafer 48, and the chip is thermally welded by reflow for mounting.

Figure 36E:
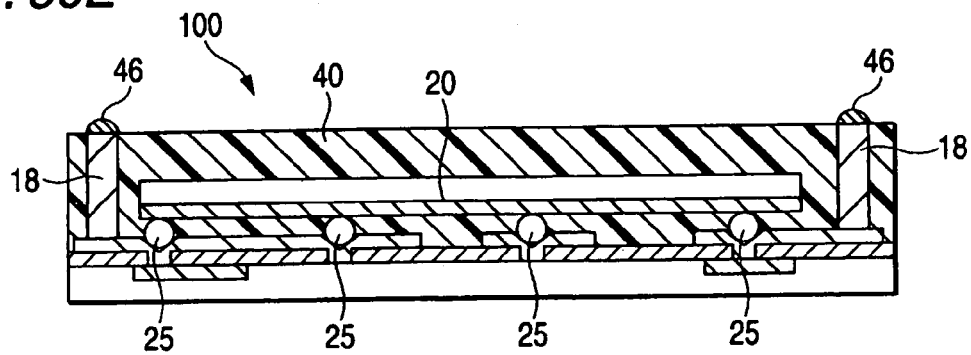

Then, the periphery (circumference) of the wafer 48 is surrounded by a mold, a liquid encapsulating resin 40 is coated from the top of the wafer 48, and then it is cured for resin encapsulation. To expose the metal post interconnects 18 buried in the encapsulating resin 40 outside, the front side is ground by cutting from the top of the wafer 48 with a grinder 56 (a cutting tool, grindstone, and buff). Ball electrodes 46 (solder balls) are formed at the tip ends of the exposed metal post interconnects 18 as external terminals by solder printing. Then, after tested, the wafer is separated into pieces by scribing to obtain the semiconductor device 100 (FIG. 36E).

In the embodiment, as similar to the seventh embodiment, the recesses 78 are disposed in the rewiring layer 16 of the 1st semiconductor chip 10, and the 2nd semiconductor chip is mounted as the ball electrodes 25 are placed at the recesses 78, thereby joining the ball electrodes 25 of the 2nd semiconductor chip throughout the bottom and the side walls (inner walls) of the recesses 78. Thus, the connection area is increased, and the reliability in joining the ball electrode 25 to the rewiring layer 16 is improved. Therefore, in the embodiment, the displacement in position caused by the vibrations in the reflow process is prevented, and the connection failure is prevented more effectively.

Furthermore, in the embodiment, the opening parts 80 are disposed in the insulating film 14 of the 1st semiconductor chip 10, the rewiring layer 16 is formed around the opening parts 80, and the recesses 78 (dents) are formed along the opening parts 80 in the rewiring layer 16. Thus, the displacement in position caused by the vibrations in the reflow process is prevented, and the connection failure is prevented more effectively with fewer process steps more inexpensively than the seventh embodiment.

Ninth Embodiment

Figure 37:
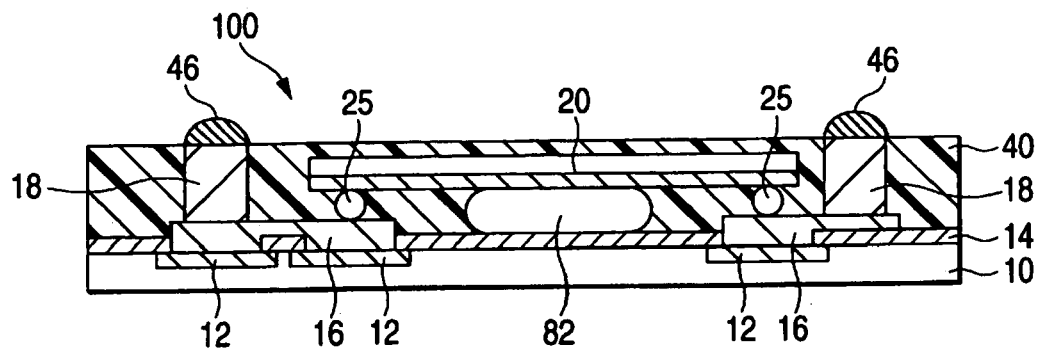
FIG. 37 is a cross-sectional view illustrating the structure of a semiconductor device in a ninth embodiment.
Figure 38:
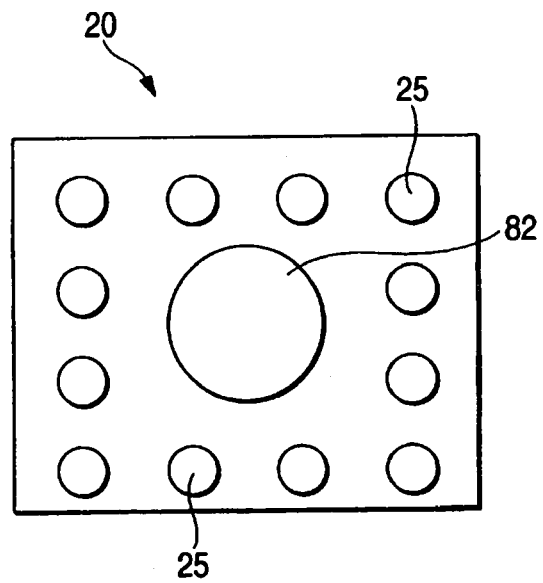
FIG. 38 is a plan view illustrating a 2nd semiconductor chip of the semiconductor device in the ninth embodiment.

FIG. 37 is a cross-sectional view illustrating the structure of a semiconductor device in a ninth embodiment. FIG. 38 is a plan view illustrating a 2nd semiconductor chip of the semiconductor device in the ninth embodiment.

In a semiconductor device 100 shown in FIG. 37, a 2nd semiconductor chip 20 is mounted on a 1st semiconductor chip 10 as it is tacked by a tack adhesive 82 (adhesive material). As shown in FIG. 38, the tack adhesive 82 is attached at the inside (chip center part) of ball electrodes 25 arranged in the periphery of the 2nd semiconductor chip 20. The position to attach the tack adhesive 82 is not defined; any positions are acceptable other than the positions where the ball electrodes 25 are disposed. The 2nd semiconductor chip 20 having the tack adhesive 82 attached is placed at a predetermined position for tacking. After that, dice bonding such as thermal welding is performed for mounting. The configurations other than this are the same as those in the fifth embodiment, thus omitting the description.

There is no limitation particularly as the tack adhesive 82 used here; inexpensive materials having a proper melting point are used.

As shown in the fifth embodiment, the rewiring layer 16 of the 1st semiconductor chip 10 is connected to the ball electrodes 25 of the 2nd semiconductor chip 20 by reflow. In the reflow process, the semiconductor device is vibrated, and the vibrations cause the rewiring layer 16 of the 1st semiconductor chip 10 to be shifted from the ball electrodes 25 of the 2nd semiconductor chip 20, sometimes generating connection failure.

Then, in the embodiment, the 2nd semiconductor chip 20 is mounted on the 1st semiconductor chip 10 as it is tacked by the tack adhesive 82, thereby preventing the displacement in position caused by the vibrations in the reflow process and preventing the connection failure.

Tenth Embodiment

Figure 39:
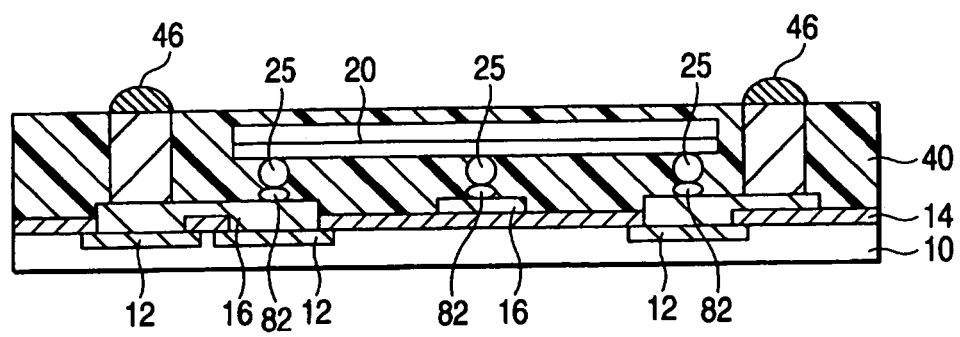
FIG. 39 is a cross-sectional view illustrating the structure of a semiconductor device in a tenth embodiment.
Figure 40A:
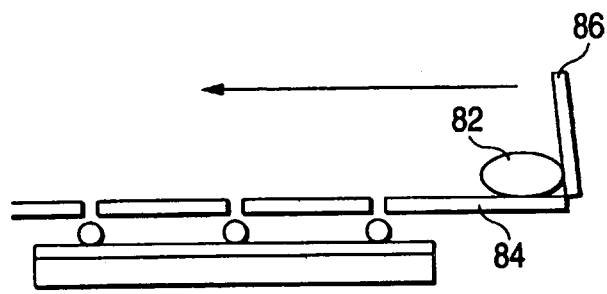
FIGS. 40A and 40B are schematic diagrams illustrating a method for attaching a tack adhesive to ball electrodes of the 2nd semiconductor chip of the semiconductor device in the tenth embodiment.
Figure 40B:
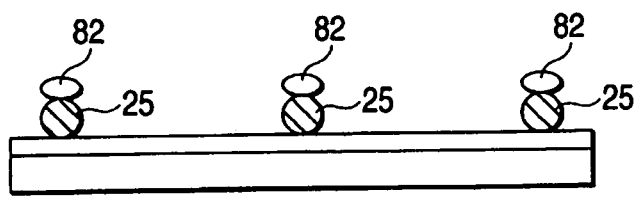

FIG. 39 is a cross-sectional view illustrating the structure of a semiconductor device in a tenth embodiment. FIGS. 40A and 40B are schematic diagrams illustrating a method for attaching a tack adhesive to ball electrodes of a 2nd semiconductor chip in the semiconductor device in the tenth embodiment.

In a semiconductor device 100 shown in FIG. 39, a 2nd semiconductor chip 20 is mounted on a 1st semiconductor chip 10 as ball electrodes 25 are tacked by a tack adhesive 82. For example, as shown in FIG. 40A, a mask 84 having openings corresponding to the ball electrodes 25 is placed on the 2nd semiconductor chip 20, the tack adhesive 82 is applied over the front side of the mask 84 by a spatula 86. Thus, the tack adhesive 82 comes out of the openings of the mask 84 to be attached at the tip ends of the ball electrodes 25 as shown in FIG. 40B. Then, the 2nd semiconductor chip 20 having the tack adhesive 82 attached at the tip ends of the ball electrodes 25 is placed at a predetermined position for tacking. After that, dice bonding such as thermal welding is performed for mounting. The configurations other than this are the same as those in the fifth embodiment, thus omitting the description.

Conductive materials are required as the tack adhesive 82 used here; solder cream is named, for example.

In the embodiment, the 2nd semiconductor chip 20 is mounted on the 1st semiconductor chip 10 as it is tacked by the tack adhesive 82, thereby preventing the displacement in position caused by the vibrations in the reflow process and preventing the connection failure.

Additionally, in the embodiment, the tack adhesive is attached at the tip ends of the ball electrodes 25 as compared with the ninth embodiment where the tack adhesive 82 is attached at the main body of the chip. Therefore, a degree of flexibility in arranging the ball electrodes 25 in the 2nd semiconductor chip 20 is increased, and the ball electrodes 25 can be placed even in the center part of the 2nd semiconductor chip 20, for example.

Eleventh Embodiment

Figure 41:
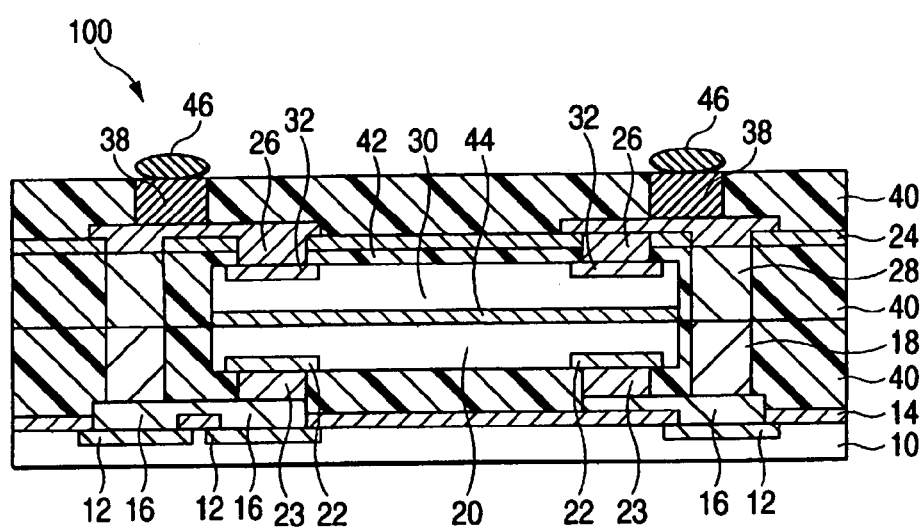
FIG. 41 is a cross-sectional view illustrating the structure of a semiconductor device in an eleventh embodiment.

FIG. 41 is a cross-sectional view illustrating the structure of a semiconductor device in an eleventh embodiment. FIGS. 42A to 49CA are cross-sectional views illustrating a fabrication method of the semiconductor device in the eleventh embodiment.

In a semiconductor device 100 shown in FIG. 41, a 2nd semiconductor chip 20 (second semiconductor chip) formed with integrated circuits (not shown) is mounted on a 1st semiconductor chip 10 (first semiconductor chip) formed with integrated circuits (not shown) as layered in the direction nearly orthogonal to the front side of the chip with the sides formed with integrated circuits facing each other, a 3rd semiconductor chip 30 (third semiconductor chip) formed with integrated circuits (not shown) is mounted on the 2nd semiconductor chip 20 (second semiconductor chip) as layered in the direction nearly orthogonal to the front side of the chip with the side opposite to the side formed with the integrated circuits facing thereto, and they are encapsulated with an encapsulating resin 40.

The 1st semiconductor chip 10 has pad electrodes 12 electrically connected to the integrated circuits thereon, and has a first insulating film 14 formed in the portions other than the pad electrodes 12. The 1st semiconductor chip 10 is formed with a first rewiring layer 16 for electrically connecting the pad electrodes 12 each other or to the integrated circuits of the 2nd semiconductor chip 20 (bump electrodes 23), and a part of the first rewiring layer 16 is formed to cover the adjacent pad electrodes 12. Then, first metal post interconnects 18 for electrically connecting to external terminals and the integrated circuits of the 3rd semiconductor chip 30 (the second rewiring layer 26) are formed on the first rewiring layer 16, and second metal post interconnects 28 are formed as the first metal post interconnects 18 are extended.

The 2nd semiconductor chip 20 has pad electrodes 22 electrically connected to the integrated circuits thereon, and has bump electrodes 23 electrically connected to the pad electrodes 22. The 2nd semiconductor chip 20 is mounted on and electrically connected to the rewiring layer 16 on the 1st semiconductor chip 10 as the side formed with integrated circuits faces thereto.

The 3rd semiconductor chip 30 has pad electrodes 32 electrically connected to the integrated circuits thereon, and has the front side protected by a passivation insulating tape 42. The 3rd semiconductor chip 30 is layered and mounted as the sides opposite to the sides formed with integrated circuits face each other by an adhesive tape 44. A second insulating film 24 for forming a second rewiring layer 26 is formed on the mounted 3rd semiconductor chip 30.

Then, the second metal post interconnects 28 are electrically connected to the pad electrodes 32 of the 3rd semiconductor chip 30 by the second rewiring layer 26, and the integrated circuits of the 1st semiconductor chip 10 and the 3rd semiconductor chip 30 are electrically connected to each other. Third metal post interconnects 38 are formed on the second rewiring layer 26, and ball electrodes 46 being external terminals are formed at the tip ends of the third metal post interconnects 38.

Hereafter, one example of a fabrication method of the semiconductor device 100 shown in FIG. 41 will be described.

Figure 42A:
FIGS. 42A to 42F are cross-sectional views illustrating a fabrication method of the semiconductor device in the eleventh embodiment.
Figure 42B:
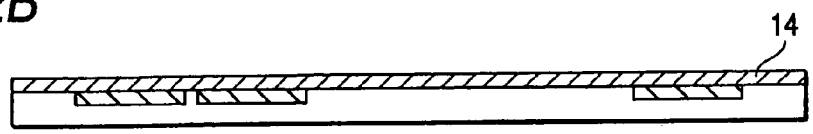
Figure 42C:
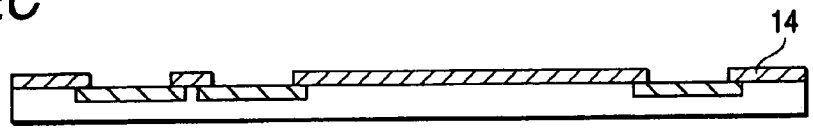
Figure 42D:
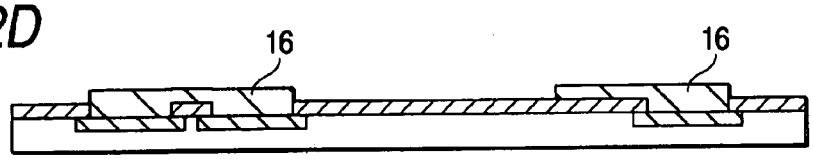

First, a wafer 48 formed with devices to be the 1st semiconductor chip 10 (FIG. 42A). The first insulating film 14 (a polyimide film, for example) is coated by spin coating on the wafer 48 where a passivation film of the pad electrodes 12 is removed (FIG. 42B). To have contact with the pad electrodes 12, a mask is used for exposure to etch the first insulating film 14 (FIG. 42C). The first rewiring layer 16 is formed as the base for forming interconnects between the pad electrodes, and the first metal post interconnects 18 by sputtering or plating (FIG. 42D).

Figure 42E:
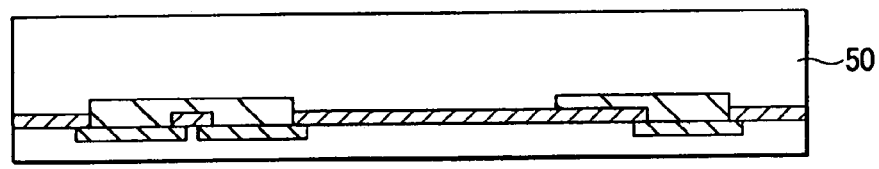
Figure 42F:
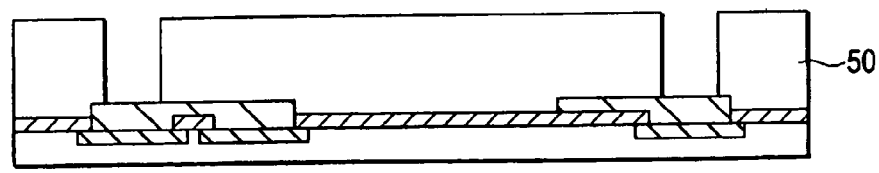
Figure 43G:
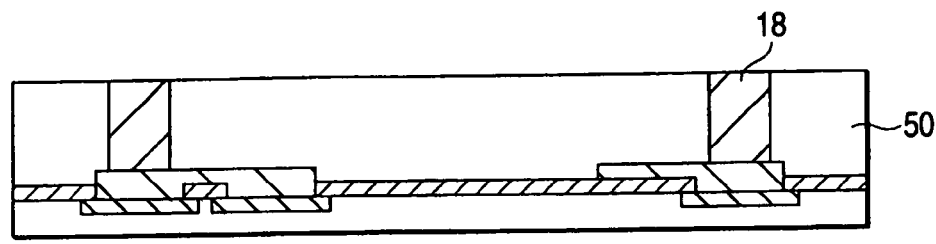
FIGS. 43G to 43I are cross-sectional views illustrating the fabrication method of the semiconductor device in the eleventh embodiment.
Figure 43H:
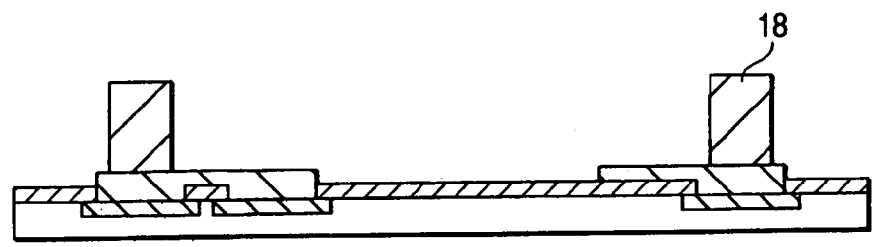

Subsequently, a resist 50 is coated over the wafer 48 for forming the first metal post interconnects 18 (FIG. 42E). To form the first metal post interconnects 18, a mask is used for exposure and then etching to form openings in the resist 50 (FIG. 42F). The first metal post interconnects 18 are formed by plating (FIG. 43G). The resist 50 is removed for cleaning (FIG. 43H). Here, since the first metal post interconnect 18 structurally needs to be raised more than the thickness of the 2nd semiconductor chip 20, it is acceptable to repeat the process steps from FIGS. 42E to 43H when a predetermined height cannot be obtained at one time.

Figure 43I:
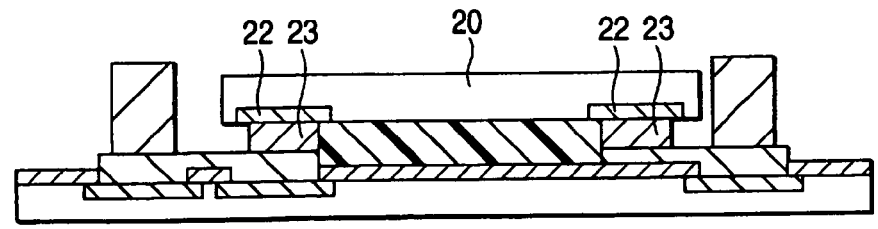

Then, the heated 2nd semiconductor chip 20 with the bump electrodes 23 is picked up by using a tool such as a flat collet for dice bonding with the use of ultrasonic waves and thermal reaction (FIG. 43I).

Figure 44J:
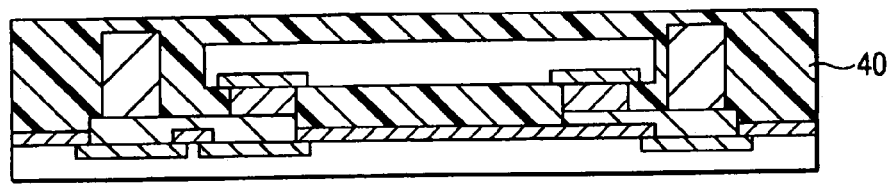
FIGS. 44J to 44M are cross-sectional views illustrating the fabrication method of the semiconductor device in the eleventh embodiment.
Figure 44K:
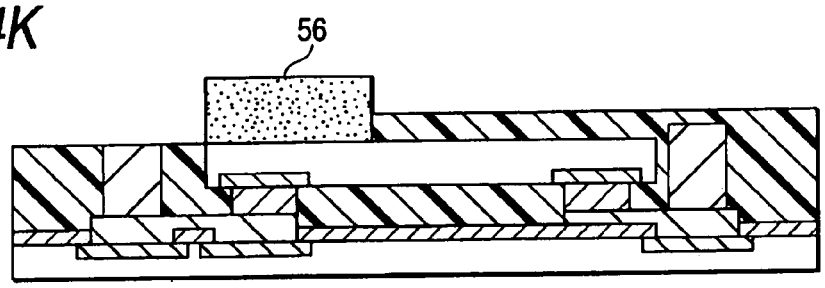

Subsequently, the periphery (circumference) of the wafer 48 is surrounded by a mold, the liquid encapsulating resin 40 is coated from the top of the wafer 48, and then it is cured for resin encapsulation (FIG. 44J). To expose the first metal post interconnects 18 buried in the encapsulating resin 40 outside, the front side is ground by cutting from the top of the wafer 48 with a grinder 56 (a cutting tool, grindstone, and buff) (FIG. 44K).

Figure 44L:
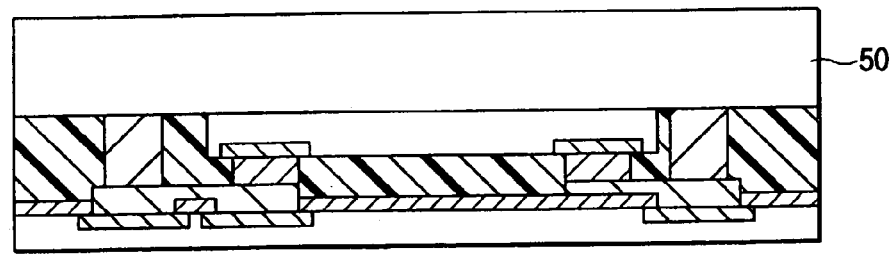
Figure 44M:
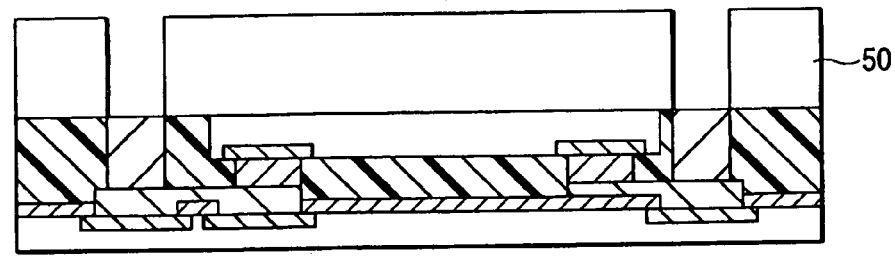
Figure 45N:
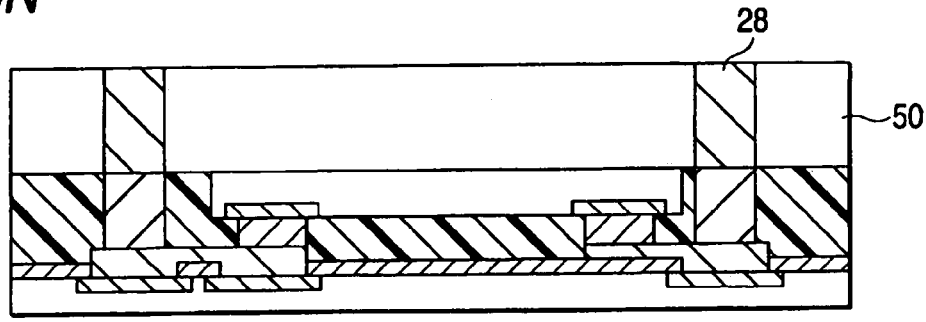
FIGS. 45N to 45Q are cross-sectional views illustrating the fabrication method of the semiconductor device in the eleventh embodiment.
Figure 45O:
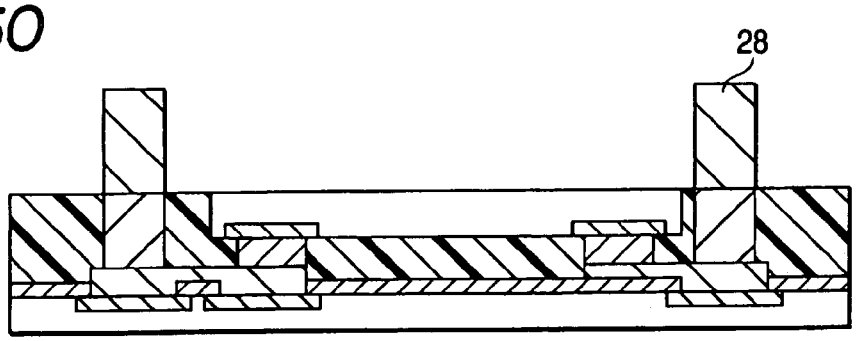

Then, to form the second metal post interconnects 28, the resist 50 is coated over the wafer 48 (FIG. 44L). To form the second metal post interconnects 28 so as to extend the first metal post interconnects 18, a mask is used for exposure and then etching to form openings in the resist 50 (FIG. 44M). The second metal post interconnects 28 are formed by plating (FIG. 45N). The resist 50 is removed for cleaning (FIG. 45O). Here, since the second metal post interconnect 28 structurally needs to be raised more than the thickness of the 3rd semiconductor chip 30, it is acceptable to repeat the process steps from FIGS. 44I to 45O when a predetermined height cannot be obtained at one time.

Figure 45P:
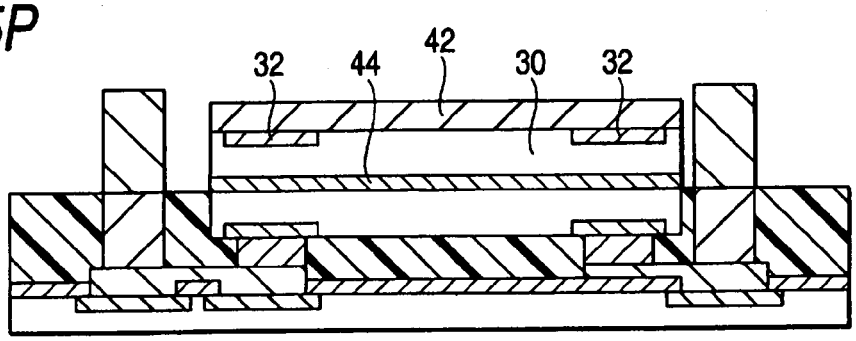

Then, the 3rd semiconductor chip 30 with the passivation insulating tape 42 (a polyimide tape, for example) is mounted on the wafer 48 (the 2nd semiconductor chip 20) by dice bonding with the adhesive tape 44 (FIG. 45P).

Figure 45Q:
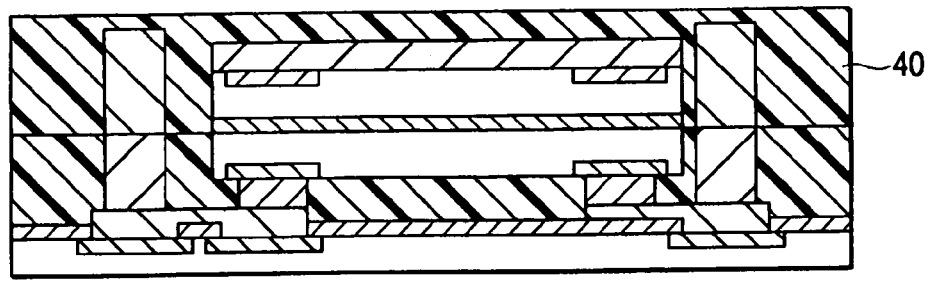
Figure 46R:
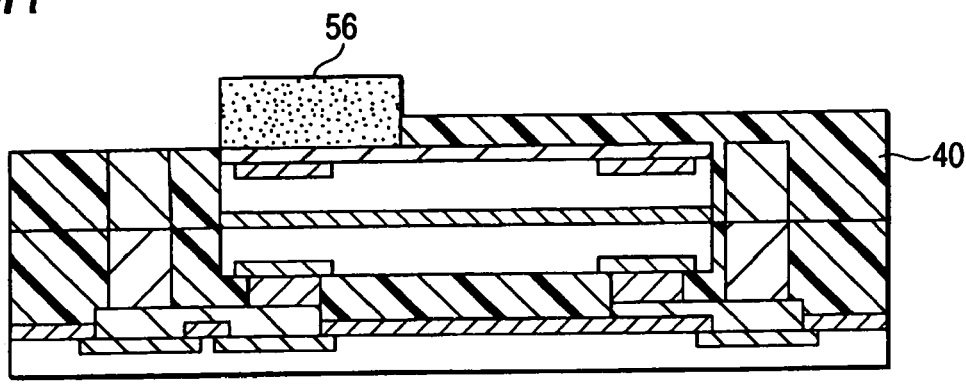
FIGS. 46R to 46T are cross-sectional views illustrating the fabrication method of the semiconductor device in the eleventh embodiment.
Figure 46S:
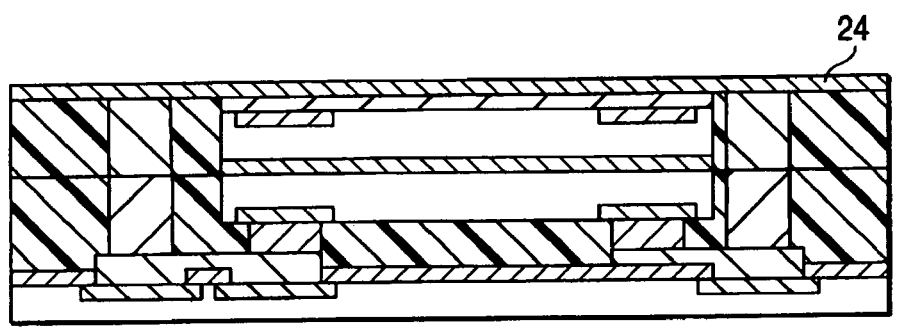
Figure 46T:
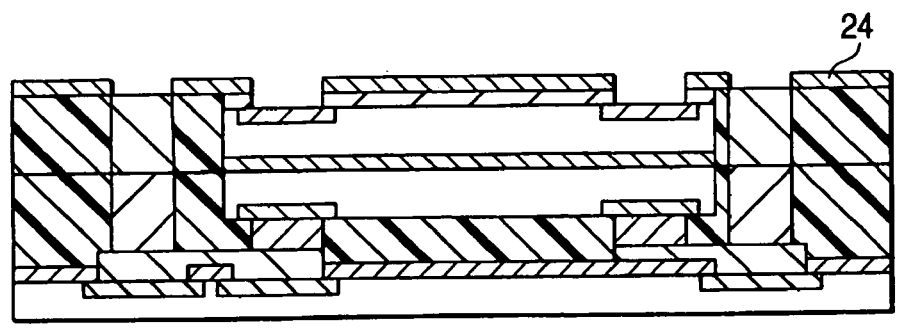
Figure 47U:
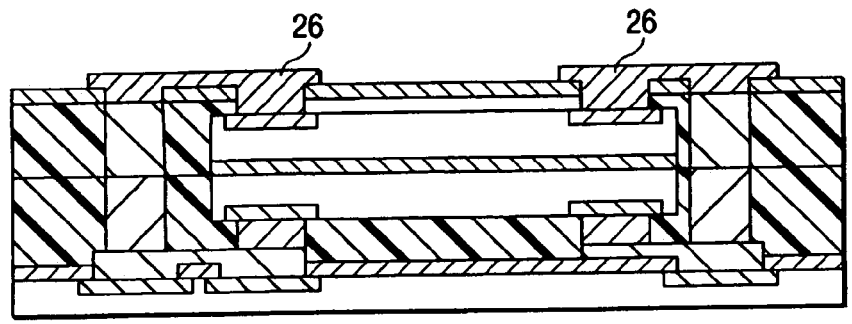
FIGS. 47U to 47W are cross-sectional views illustrating the fabrication method of the semiconductor device in the eleventh embodiment.

Subsequently, the periphery (circumference) of the wafer 48 is surrounded by a mold, the liquid encapsulating resin 40 is coated from the top of the wafer 48, and then it is cured for resin encapsulation (FIG. 45Q). To expose the first metal post interconnects 18 buried in the encapsulating resin 40 outside, the front side is ground by cutting from the top of the wafer 48 with the grinder 56 (a cutting tool, grindstone, and buff) (FIG. 46R). To form the second rewiring layer 26, the second insulating film 24 (a polyimide tape, for example) is formed on the front side (FIG. 46S). To have contact with the second metal post interconnects 28 and the pad electrodes 32, a mask is used for exposure to etch the second insulating film 24 (FIG. 46T). The second rewiring layer 26 is formed as the base for forming interconnects between the pad electrodes, and the second metal post interconnects 28 by sputtering or plating (FIG. 47U). In this manner, the second metal post interconnects and the pad electrodes 32 of the 3rd semiconductor chip 30 can be rewired simultaneously by sputtering or plating.

Figure 47V:
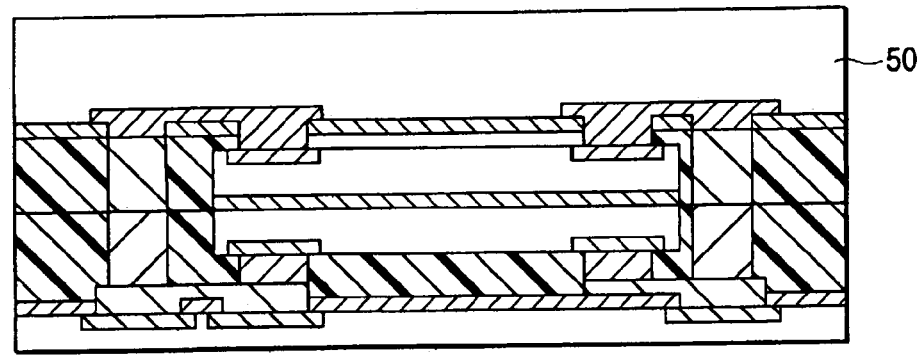
Figure 47W:
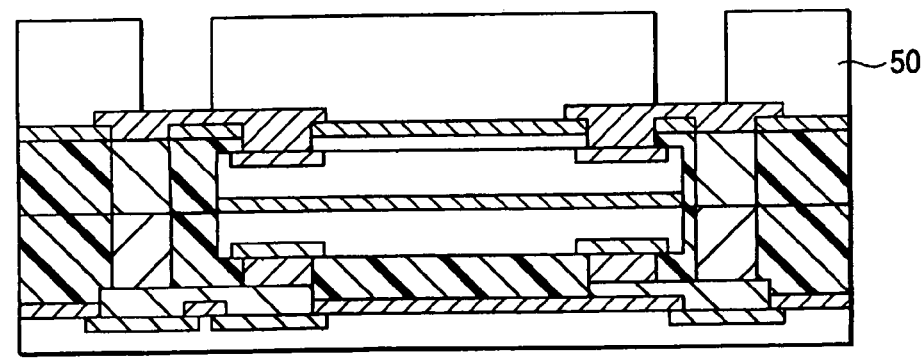
Figure 48X:
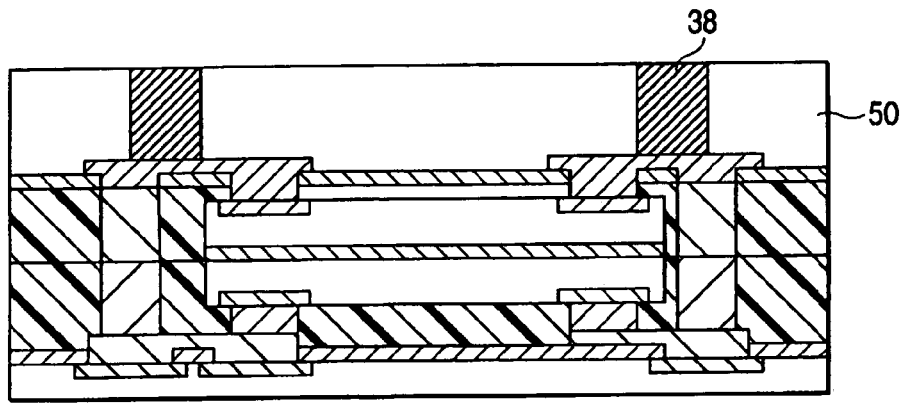
FIGS. 48X to 48Z are cross-sectional views illustrating the fabrication method of the semiconductor device in the eleventh embodiment.
Figure 48Y:
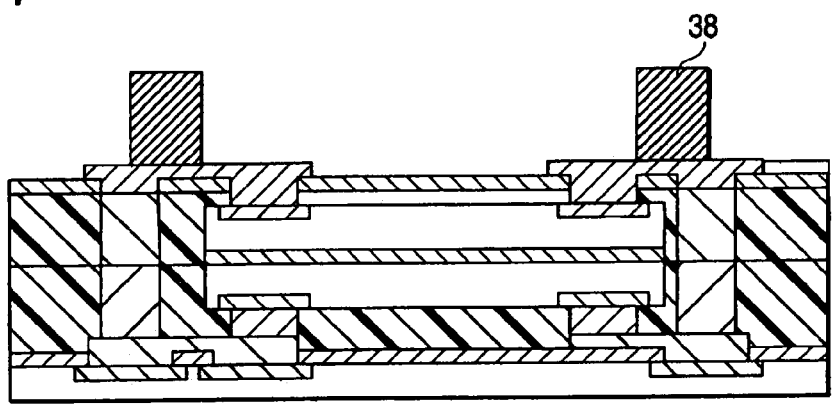

Then, to form the third metal post interconnects 38, the resist 50 is coated over the wafer 48 (FIG. 47V). To form the third metal post interconnects 38, a mask is used for exposure and then etching to form openings in the resist 50 (FIG. 47W). The third metal post interconnects 38 are formed by plating (FIG. 48X). The resist 50 is removed for cleaning (FIG. 48Y)

Figure 48Z:
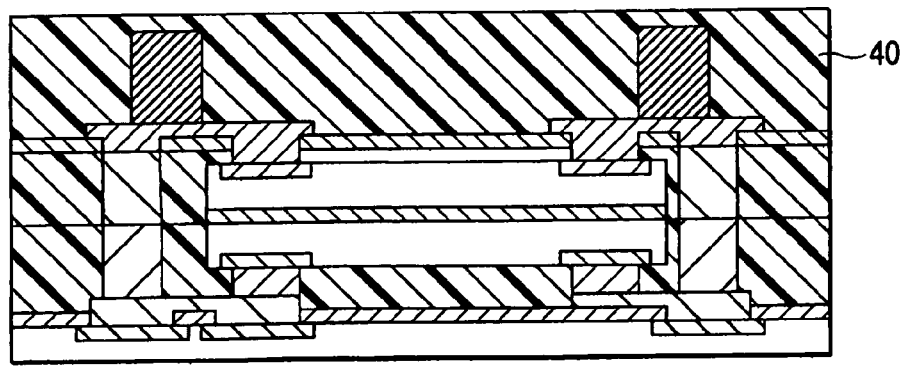
Figure 49A:
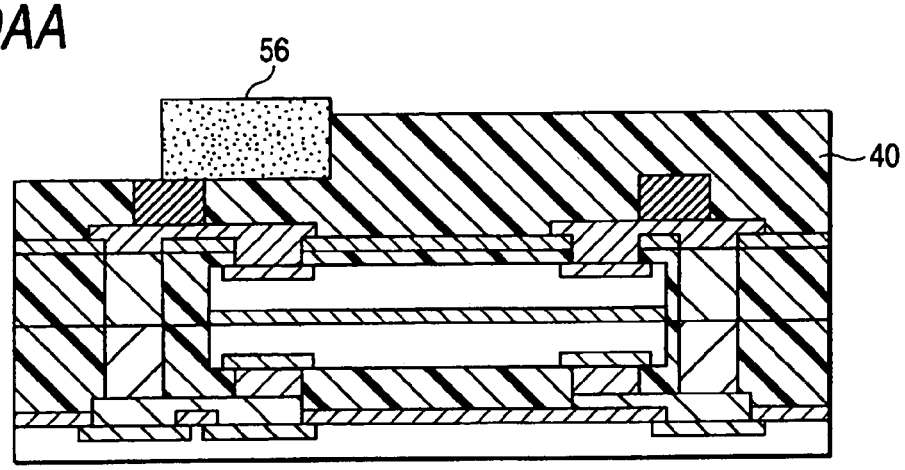
FIGS. 49AA to 49CA are cross-sectional views illustrating the fabrication method of the semiconductor device in the eleventh embodiment.
Figure 49B:
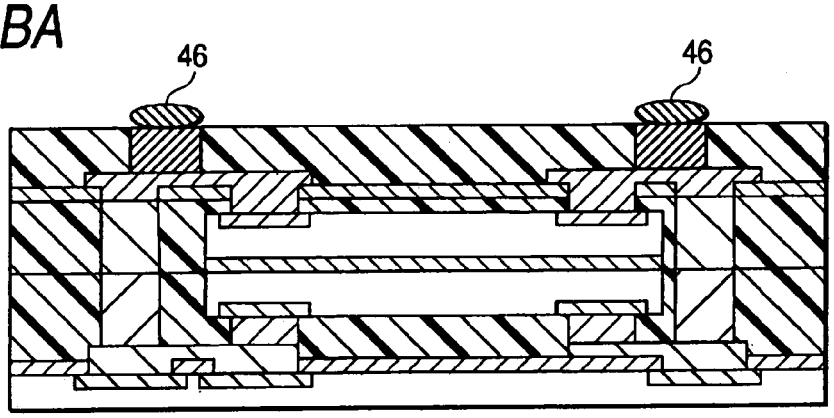
Figure 49C:
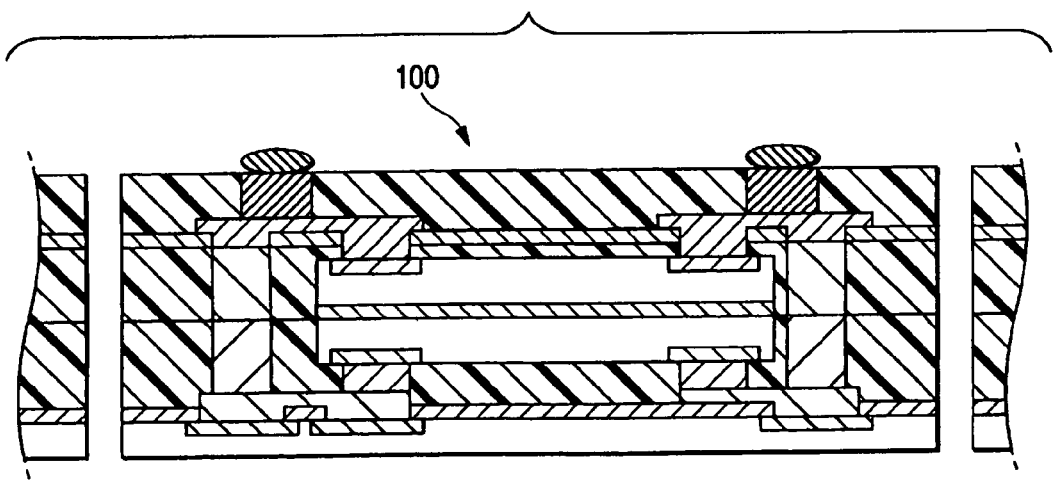

Subsequently, the periphery (circumference) of the wafer 48 is surrounded by a mold, the liquid encapsulating resin 40 is coated from the top of the wafer 48, and then it is cured for resin encapsulation (FIG. 48Z). To expose the third metal post interconnects 38 buried in the encapsulating resin 40 outside, the front side is ground by cutting from the top of the wafer 48 with the grinder 56 (a cutting tool, grindstone, and buff) (FIG. 49AA). The ball electrodes 46 (solder balls) are formed at the tip ends of the exposed third metal post interconnects 38 as external terminals by solder printing (FIG. 49BA). Then, after tested, the wafer is separated into pieces by scribing to obtain the semiconductor device 100 (FIG. 49CA)

In the embodiment, the 2nd semiconductor chip 20 (second semiconductor chip) and the 3rd semiconductor chip 30 (third semiconductor chip) are mounted as layered in the direction nearly orthogonal to the front side of the chips with the sides opposite to the sides formed with integrated circuits facing each other. Therefore, the insulating film and the rewiring layer between the 2nd semiconductor chip 20 and the 3rd semiconductor chip 30 are unnecessary, the device can be formed into a multi-chip in lower profile, and large scale integration is feasible as well.

Twelfth Embodiment

Figure 50:
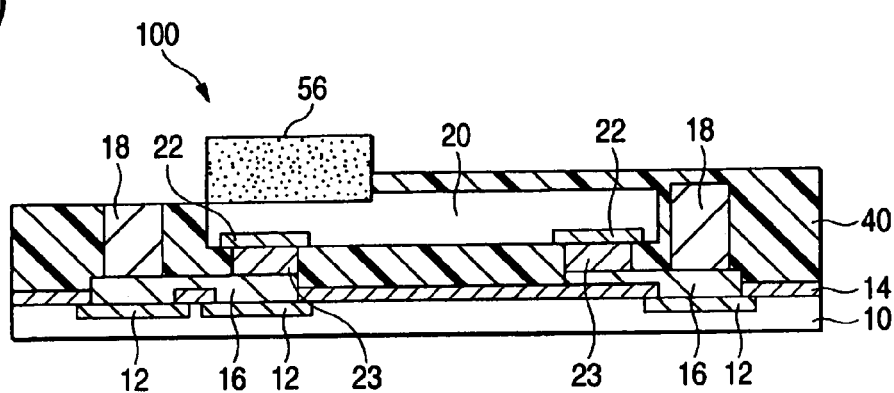
FIG. 50 is a schematic diagram illustrating a semiconductor device in a twelfth embodiment.
Figure 51:
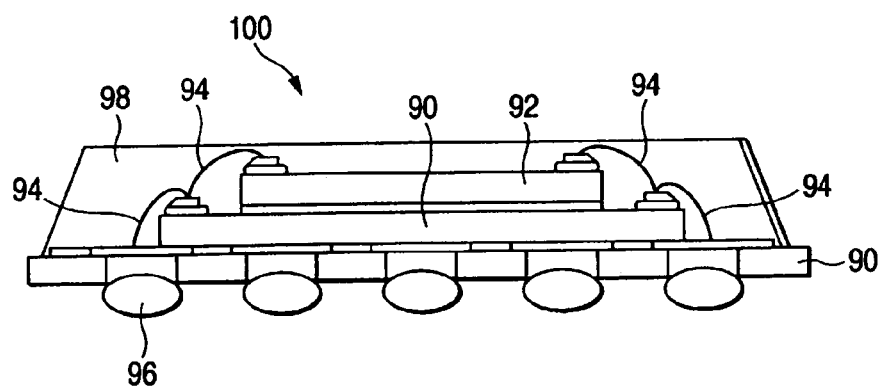
FIG. 51 is a cross-sectional view illustrating one example of the MCP structure in which a traditional semiconductor chip is formed into a multi-chip.

FIG. 50 is a schematic diagram illustrating a semiconductor device in a twelfth embodiment.

As shown in FIG. 50, the embodiment is that 1st and 2nd semiconductor chips 10 and 20 are encapsulated with an encapsulating resin 40, the 2nd semiconductor chip 20 is ground in the side opposite to the side formed with integrated circuits by cutting with a grinder (a cutting tool, grindstone, and buff) along with the encapsulating resin, in the fourth to eleventh embodiments where the 2nd semiconductor chip 20 is mounted on the 1st semiconductor chip 10 as the sides formed with integrated circuits face each other.

Generally, the chip needs to be thin in order to suppress the finished thickness. However, when the semiconductor chip is background and cut in a wafer state before separated into pieces, a problem arises that cracks are generated in the wafer in transfer or in dice bonding to reduce assembly yields.

Then, in the embodiment, when the side opposite to the side formed with integrated circuits is cut along with the encapsulating resin 40 after the 2nd semiconductor chip 20 is mounted, the reduction in assembly yields caused by the cracks in the wafer in transfer or in dice bonding can be prevented because the 2nd semiconductor chip 20 is thick until resin encapsulation. Additionally, since the encapsulating resin 40 and the 2nd semiconductor chip 20 are ground at the same time, resin encapsulation and chip grinding, which are separately needed in general, can be performed at a single cutting process step, thus allowing cost reductions.

Furthermore, in the embodiment, since the 2nd semiconductor chip 20 does not need to be considered to have cracks in transfer or in dice bonding, the device can be cut thinner than that being background and cut in the wafer state before separated into pieces, the device can be formed into a multi-chip in lower profile, and large scale integration is feasible as well.

Moreover, it is needles to say that any of the semiconductor devices and the fabrication methods of the same in the invention are not interpreted limitedly, which can be implemented in the scope satisfying the requirements of the invention.

As described above, according to the invention, the semiconductor device intending to reduce the packaging area and formed into a multi-chip and the fabrication method of the same can be provided.

The present invention can be applied to a method of manufacturing a semiconductor device. For example, a fabrication method of the semiconductor device having the following steps is considered. The steps includes forming the first wiring on the first semiconductor chip; forming an insulating mask layer on the first semiconductor chip, the insulating mask layer having opening parts placed at a plurality of first areas on the first wiring; forming the post electrode in the opening parts of the mask layer; removing the mask layer placed in a second area surrounded by the plurality of the first areas; mounting the second semiconductor chip on the second area; and encapsulating the periphery of the second semiconductor chip with a second encapsulating resin.

Further, another method may includes the following steps of forming the first wiring on the first semiconductor chip; forming a recess or opening part in a part of the first wiring; and mounting the second semiconductor chip on the first semiconductor chip so as to place the projecting electrode of the second semiconductor chip at the recess or opening part. In the above method, the step of forming the recess in the part of the first wiring may be formed by plating for several times. Further in the above method, the step of forming the first wiring on the first semiconductor chip may include the step of forming an insulating film having an opening part on the first semiconductor chip, the step of forming the recess in the part of the first wiring includes the step of forming the first wiring on the opening part and the insulating film, and the recess is formed by forming the first wiring on the opening part of the insulating film.

Another method may includes the following steps of mounting the second semiconductor chip on the first semiconductor chip; encapsulating the first and second semiconductor chips with a resin; and cutting the resin and the back side of the second semiconductor chip.

What is claimed is:

1. A semiconductor device comprising:
   a first semiconductor chip having a front side, a back side, and first pad electrodes formed on the front side and electrically connected to an integrated circuit formed on the front side;
   a first conductive pattern which is composed of a first conductive layer and which is electrically connected to one of the first pad electrodes;
   a second conductive pattern which is composed of the first conductive layer and which is electrically connected to a second one of the first pad electrodes and another of the first pad electrodes adjacent to the second one of the first pad electrodes;
   first post electrodes which are formed on the first conductive pattern and the second conductive pattern;
   a second semiconductor chip having a front side, a back side, and second pad electrodes formed on the front side thereof, the second semiconductor chip being mounted on the front side of the first semiconductor chip;
   a third conductive pattern which is composed of a second conductive layer and which is electrically connected to the first post electrodes;
   an encapsulating resin which encapsulates the front surfaces of the first and second semiconductor chips; and
   external terminals which are formed over the third conductive pattern and are electrically connected to the third conductive pattern.

2. The semiconductor device according to claim 1, wherein the back side of the second semiconductor chip faces the front side of the first semiconductor chip, and a passivation film is formed on the front side of the second semiconductor chip.

3. The semiconductor device according to claim 1, wherein the first post electrode formed on the second conductive pattern is formed near almost a center part of the second conductive pattern.

4. The semiconductor device according to claim 1, wherein the back side of the second semiconductor chip faces the front side of the first semiconductor chip, and wherein the semiconductor device further includes
   second post electrodes formed on the front side near a periphery of the first semiconductor chip simultaneously with the first post electrodes, the second post electrodes are recognition costs that identify the periphery of the first semiconductor chip.

5. The semiconductor device according to claim 1, further comprising a third semiconductor chip having a front side, a back side, and third pad electrodes on the front side thereon,
   wherein the front side of the second semiconductor chip faces the front side of the first semiconductor chip, and the back side of the third semiconductor chip faces the back side of the second semiconductor chip.

6. The semiconductor device according to claim 1, further comprising:
   second post electrodes which are formed on the third conductive pattern and wherein the external terminals are formed on the second post electrodes.

7. A semiconductor device comprising:
- a first semiconductor chip having a front side, a back side, and first pad electrodes formed on the front side and electrically connected to an integrated circuit formed on the front side;
- a first conductive pattern which is composed of a first conductive layer and which is electrically connected to one of the first pad electrodes;
- a second conductive pattern which is composed of the first conductive layer and which is electrically connected to a second one of the first pad electrodes and another of the first pad electrodes adjacent to the second one of the first pad electrodes;
- first post electrodes which are formed on the first conductive pattern and the second conductive pattern;
- a second semiconductor chip having a front side, a back side, and second pad electrodes formed on the front side thereof, the second semiconductor chip being mounted on the front side of the first semiconductor chip;
- an encapsulating resin which encapsulates the front surfaces of the first and second semiconductor chips; and
- external terminals which are formed over the encapsulating resin and which are electrically connected to the second conductive pattern and at least one of the second pad electrodes.

8. The semiconductor device according to claim 7, wherein the back side of the second semiconductor chip faces the front side of the first semiconductor chip, and a passivation film is formed on the front side of the second semiconductor chip.

9. The semiconductor device according to claim 8, further comprising a third conductive pattern which is composed of a second conductive layer and which is electrically connected to the first post electrodes.

10. The semiconductor device according to claim 9, further comprising:
- second post electrodes which are formed on the third conductive pattern and wherein the external terminals are formed on the second post electrodes.

11. The semiconductor device according to claim 7, wherein the front side of the second semiconductor chip faces the front side of the first semiconductor chip.

12. The semiconductor device according to claim 11, wherein the second semiconductor chip includes projecting electrodes on the front side thereof electrically connected to the first and second conductive patterns.

13. The semiconductor device according to claim 12, wherein the first conductive pattern is provided with an opening part, and one of the projecting electrodes is placed on the opening part of the first conductive pattern.

14. The semiconductor device according to claim 12, wherein the first conductive pattern is provided with a recess, and one of the projecting electrodes is placed on the recess of the first conductive pattern.

15. The semiconductor device according to claim 12, wherein the projecting electrodes are connected to the first conductive pattern through an adhesive material.

16. The semiconductor device according to claim 7, wherein the front side of the second semiconductor chip is connected to the front side of the first semiconductor chip through an adhesive material.

* * * * *